US011923729B2

(12) United States Patent
Moura et al.

(10) Patent No.: US 11,923,729 B2
(45) Date of Patent: *Mar. 5, 2024

(54) POSITION FEEDBACK FOR SEALED ENVIRONMENTS

(71) Applicant: Brooks Automation US, LLC, Chelmsford, MA (US)

(72) Inventors: Jairo T. Moura, Marlboro, MA (US); Reza Saeidpourazar, Nashua, NH (US); Branden Gunn, Reading, MA (US); Matthew W. Coady, Hollis, NH (US); Ulysses Gilchrist, Reading, MA (US)

(73) Assignee: Brook Automation US, LLC, Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/816,876

(22) Filed: Aug. 2, 2022

(65) Prior Publication Data

US 2022/0385142 A1 Dec. 1, 2022

Related U.S. Application Data

(63) Continuation of application No. 16/838,785, filed on Apr. 2, 2020, now Pat. No. 11,404,939, which is a (Continued)

(51) Int. Cl.
*H02K 11/215* (2016.01)
*H01L 21/67* (2006.01)
(Continued)

(52) U.S. Cl.
CPC ...... *H02K 11/215* (2016.01); *H01L 21/67259* (2013.01); *H01L 21/67706* (2013.01);
(Continued)

(58) Field of Classification Search
CPC ......... H01L 21/67259; H01L 21/67742; H01L 21/67706; H01L 21/68707; H02K 1/24; H02K 11/215; H02K 5/128; H02K 1/146
(Continued)

(56) References Cited

U.S. PATENT DOCUMENTS

| 39,748 A | 9/1863 | Price, Jr. |
|---|---|---|
| 4,081,703 A | 3/1978 | Madsen et al. |
| 4,197,488 A | 4/1980 | Kant |
| 4,611,157 A | 9/1986 | Miller et al. |
| 4,626,719 A | 12/1986 | Foster |
| 4,661,756 A | 4/1987 | Murphy et al. |
| 4,670,696 A | 6/1987 | Byrne et al. |

(Continued)

FOREIGN PATENT DOCUMENTS

| CN | 1502161 | 6/2004 |
|---|---|---|
| CN | 1574598 | 2/2005 |

(Continued)

OTHER PUBLICATIONS

International Search Report, International Application No. PCT/US2014/065392, dated Mar. 13, 2015.
(Continued)

*Primary Examiner* — Alex W Mok
(74) *Attorney, Agent, or Firm* — Perman & Green, LLP

(57) ABSTRACT

A transport apparatus comprising a housing, a variable reluctance drive mounted to the housing, and at least one transport arm connected to the variable reluctance drive where the drive includes at least one rotor having salient poles of magnetic permeable material and disposed in an isolated environment, at least one stator having salient pole structures each defining a salient pole with corresponding coil units coiled around the respective salient pole structure and disposed outside the isolated environment where the at least one salient pole of the at least one stator and the at least one salient pole of the rotor form a closed magnetic flux circuit between the at least one rotor and the at least one stator, at least one seal partition configured to isolate the isolated environment; and at least one sensor including a magnetic sensor member connected to the housing, at least one sensor track connected to the at least one rotor, where the at least one seal partition is disposed between and separates the magnetic sensor member and the at least one sensor track so that the at least one sensor track is disposed (Continued)

in the isolated environment and the magnetic sensor member is disposed outside the isolated environment.

19 Claims, 30 Drawing Sheets

Related U.S. Application Data continuation of application No. 14/540,058, filed on Nov. 13, 2014, now Pat. No. 10,742,092.

(60) Provisional application No. 61/903,726, filed on Nov. 13, 2013.

(51) Int. Cl.
    *H01L 21/677*     (2006.01)
    *H01L 21/687*     (2006.01)
    *H02K 1/14*     (2006.01)
    *H02K 1/24*     (2006.01)
    *H02K 5/128*     (2006.01)

(52) U.S. Cl.
    CPC .. *H01L 21/67742* (2013.01); *H01L 21/68707* (2013.01); *H02K 1/146* (2013.01); *H02K 1/24* (2013.01); *H02K 5/128* (2013.01)

(58) Field of Classification Search
    USPC ....................................................... 310/68 B
    See application file for complete search history.

(56) References Cited

U.S. PATENT DOCUMENTS

| | | |
|---|---|---|
| 4,748,362 A | 5/1988 | Hedlund |
| 4,868,477 A | 9/1989 | Anderson et al. |
| 4,917,925 A | 4/1990 | Loretti et al. |
| 4,922,197 A | 5/1990 | Juds et al. |
| 4,951,601 A | 8/1990 | Maydan et al. |
| 4,992,733 A | 2/1991 | Griebeler |
| 5,076,205 A | 12/1991 | Vowles et al. |
| 5,140,243 A | 8/1992 | Lyons et al. |
| 5,296,773 A | 3/1994 | El-Antably et al. |
| 5,376,862 A | 12/1994 | Stevens |
| 5,428,257 A | 6/1995 | Lurkens |
| 5,450,009 A | 9/1995 | Murakami |
| 5,475,304 A | 12/1995 | Prinz |
| 5,485,046 A | 1/1996 | Kaplan et al. |
| 5,522,653 A | 6/1996 | Fulks et al. |
| 5,539,266 A | 7/1996 | Stevens |
| 5,545,964 A | 8/1996 | Stephenson et al. |
| 5,584,647 A | 12/1996 | Uehara et al. |
| 5,621,294 A | 4/1997 | Bessette et al. |
| 5,623,177 A | 4/1997 | Dimatteo et al. |
| 5,652,493 A | 7/1997 | Hendershot, Jr. |
| 5,720,590 A | 2/1998 | Hofmeister |
| 5,739,663 A | 4/1998 | Brown |
| 5,813,823 A | 9/1998 | Hofmeister |
| 5,828,153 A | 10/1998 | McClelland |
| 5,852,355 A | 12/1998 | Turner |
| 5,855,681 A | 1/1999 | Maydan et al. |
| 5,864,477 A | 1/1999 | Webster |
| 5,866,962 A | 2/1999 | Kim |
| 5,871,588 A | 2/1999 | Moslehi et al. |
| 5,894,760 A | 4/1999 | Caveney |
| 5,899,658 A | 5/1999 | Hofmeister |
| 5,914,548 A | 6/1999 | Watanabe et al. |
| 5,923,141 A | 7/1999 | McHugh |
| 6,091,170 A | 7/2000 | Mayes et al. |
| 6,114,789 A | 9/2000 | Pengov et al. |
| 6,150,791 A | 11/2000 | Fulton |
| 6,181,036 B1 | 1/2001 | Kazama et al. |
| 6,201,368 B1 | 3/2001 | Webster |
| 6,203,294 B1 | 3/2001 | Turley et al. |
| 6,225,767 B1 | 5/2001 | Lovett et al. |
| 6,242,874 B1 | 6/2001 | Kalpathi et al. |
| 6,252,325 B1 | 6/2001 | Nashiki |
| 6,285,101 B1 | 9/2001 | Kazama et al. |
| 6,297,613 B1 | 10/2001 | Elliott et al. |
| 6,305,694 B1 | 10/2001 | Yamazumi et al. |
| 6,313,597 B1 | 11/2001 | Elliott et al. |
| 6,335,578 B1 | 1/2002 | Katsumi et al. |
| 6,372,293 B1 | 4/2002 | Mathus et al. |
| 6,460,567 B1 | 10/2002 | Hansen, III et al. |
| 6,468,353 B1 | 10/2002 | Perlov et al. |
| 6,492,756 B1 | 12/2002 | Maslov et al. |
| 6,498,447 B2 | 12/2002 | Mann et al. |
| 6,525,504 B1 | 2/2003 | Nygren et al. |
| 6,548,932 B1 | 4/2003 | Weiglhofer et al. |
| 6,617,712 B1 | 9/2003 | Dondi |
| 6,639,378 B2 | 10/2003 | Turner et al. |
| 6,700,272 B1 | 3/2004 | Lindner |
| 6,700,273 B1 | 3/2004 | Ojima et al. |
| 6,758,876 B2 | 7/2004 | Suzuki et al. |
| 6,759,826 B2 | 7/2004 | Tankard |
| 6,794,791 B2 | 9/2004 | Ben Ahmed et al. |
| 6,823,725 B2 | 11/2004 | Lohberg |
| 6,828,710 B1 | 12/2004 | Gabrys |
| 6,857,635 B1 | 2/2005 | Li et al. |
| 6,900,573 B2 | 5/2005 | Edwards et al. |
| 6,936,992 B2 | 8/2005 | Elliott et al. |
| 7,044,003 B2 | 5/2006 | Flammer et al. |
| 7,057,362 B2 | 6/2006 | Norman |
| 7,071,659 B1 | 7/2006 | Torrey et al. |
| 7,090,222 B2 | 8/2006 | Watanabe et al. |
| 7,112,957 B2 * | 9/2006 | Bicking ................... G01B 7/14 324/207.21 |
| 7,141,965 B2 | 11/2006 | Breuer et al. |
| 7,208,906 B2 | 4/2007 | Turner et al. |
| 7,230,360 B2 | 6/2007 | Desai et al. |
| 7,268,516 B2 | 9/2007 | Tankard |
| 7,321,113 B2 | 1/2008 | Hare et al. |
| 7,368,705 B2 | 5/2008 | Hare et al. |
| 7,392,565 B2 | 7/2008 | Holbrook et al. |
| 7,405,556 B2 | 7/2008 | Breuer et al. |
| 7,427,845 B2 | 9/2008 | Burse |
| 7,592,712 B2 | 9/2009 | Perlo et al. |
| 7,608,813 B1 | 10/2009 | Milvich et al. |
| 7,639,005 B2 | 12/2009 | Qian et al. |
| 7,719,159 B2 | 5/2010 | Petro et al. |
| 7,804,269 B2 | 9/2010 | Randall |
| 7,834,618 B2 | 11/2010 | Moura et al. |
| 7,852,070 B2 | 12/2010 | Yamada et al. |
| 7,901,539 B2 | 3/2011 | Bluck et al. |
| 7,904,182 B2 | 3/2011 | Hosek et al. |
| 7,906,931 B2 | 3/2011 | Randall |
| 7,950,890 B2 | 5/2011 | Nakamura et al. |
| 7,988,398 B2 | 8/2011 | Hofmeister et al. |
| 7,994,676 B2 | 8/2011 | Imazu et al. |
| 8,008,884 B2 | 8/2011 | Krupyshev et al. |
| 8,094,323 B2 | 1/2012 | Kapner |
| 8,129,984 B2 | 3/2012 | Hosek et al. |
| 8,222,892 B2 | 7/2012 | Hosek et al. |
| 8,293,066 B2 | 10/2012 | Bluck et al. |
| 8,303,764 B2 | 11/2012 | Bluck et al. |
| 8,309,906 B2 | 11/2012 | Kapner et al. |
| 8,419,341 B2 | 4/2013 | Hoey et al. |
| 8,450,999 B2 | 5/2013 | Wolschlager et al. |
| 8,749,105 B2 | 6/2014 | Arita et al. |
| 9,541,611 B2 | 1/2017 | Wang et al. |
| 2001/0010453 A1 | 8/2001 | Marcinkiewicz |
| 2001/0024611 A1 | 9/2001 | Woodruff et al. |
| 2001/0036398 A1 | 11/2001 | Hofmeister |
| 2002/0125782 A1 | 9/2002 | Peachee et al. |
| 2002/0135358 A1 | 9/2002 | Sager et al. |
| 2002/0175653 A1 | 11/2002 | Elliot et al. |
| 2002/0185990 A1 | 12/2002 | Elliott et al. |
| 2003/0016686 A1 | 1/2003 | Wynne et al. |
| 2003/0019686 A1 | 1/2003 | Fukuda et al. |
| 2003/0042864 A1 | 3/2003 | Lequesne et al. |
| 2004/0052125 A1 | 3/2004 | Tankard |
| 2004/0066165 A1 | 4/2004 | Kamio et al. |
| 2004/0151562 A1 | 8/2004 | Hofmeister et al. |
| 2004/0189240 A1 | 9/2004 | Islam et al. |

(56) References Cited

U.S. PATENT DOCUMENTS

| | | |
|---|---|---|
| 2005/0011288 A1 | 1/2005 | Flammer et al. |
| 2005/0105991 A1 | 5/2005 | Hofmeister et al. |
| 2005/0120578 A1 | 6/2005 | Vandermeulen |
| 2005/0212371 A1 | 9/2005 | McClelland |
| 2006/0017340 A1 | 1/2006 | Kozaki et al. |
| 2006/0021176 A1 | 2/2006 | Moein et al. |
| 2006/0036384 A1 | 2/2006 | Moriarty et al. |
| 2006/0036385 A1 | 2/2006 | Tankard |
| 2006/0045664 A1 | 3/2006 | Niewmierzycki et al. |
| 2006/0053577 A1 | 3/2006 | Moein et al. |
| 2006/0073276 A1 | 4/2006 | Antonissen |
| 2006/0102078 A1 | 5/2006 | Fairbairn et al. |
| 2006/0175913 A1 | 8/2006 | Hempe et al. |
| 2006/0182529 A1 | 8/2006 | Hiroki |
| 2007/0020081 A1 | 1/2007 | Gilchrist et al. |
| 2007/0022304 A1 | 1/2007 | Yanagawa |
| 2007/0029890 A1 | 2/2007 | Deodhar et al. |
| 2007/0183871 A1 | 8/2007 | Hofmeister et al. |
| 2007/0280813 A1 | 12/2007 | Nakamura et al. |
| 2008/0011334 A1 | 1/2008 | Rye et al. |
| 2008/0019816 A1 | 1/2008 | Sato |
| 2008/0116886 A1 | 5/2008 | Yamada et al. |
| 2008/0121064 A1 | 5/2008 | Todorov |
| 2008/0131228 A1 | 6/2008 | Sheets |
| 2008/0290762 A1 | 11/2008 | Lott et al. |
| 2009/0001917 A1 | 1/2009 | Hosek et al. |
| 2009/0003976 A1 | 1/2009 | Hofmeister et al. |
| 2009/0015248 A1 | 1/2009 | Moura et al. |
| 2009/0022571 A1 | 1/2009 | Krupyshev et al. |
| 2009/0033173 A1 | 2/2009 | Moura et al. |
| 2009/0078134 A1 | 3/2009 | Rothlein et al. |
| 2009/0102460 A1 | 4/2009 | Schott et al. |
| 2009/0140748 A1 | 6/2009 | Lindsey et al. |
| 2009/0162179 A1 | 6/2009 | Hosek et al. |
| 2009/0167119 A1 | 7/2009 | Nakayama et al. |
| 2009/0191030 A1 | 7/2009 | Bluck et al. |
| 2009/0243413 A1 | 10/2009 | Gilchrist et al. |
| 2010/0063775 A1 | 3/2010 | Colling |
| 2010/0123426 A1 | 5/2010 | Nashiki et al. |
| 2010/0207616 A1 | 8/2010 | Wolschlager et al. |
| 2010/0295389 A1 | 11/2010 | Tessier et al. |
| 2011/0058967 A1 | 3/2011 | Arita et al. |
| 2011/0077892 A1 | 3/2011 | Emami et al. |
| 2011/0133582 A1 | 6/2011 | Bingler |
| 2011/0156514 A1 | 6/2011 | Watanabe et al. |
| 2011/0171887 A1 | 7/2011 | Tanimoto et al. |
| 2011/0173496 A1 | 7/2011 | Hosek et al. |
| 2011/0181221 A1 | 7/2011 | Asahi et al. |
| 2011/0234130 A1 | 9/2011 | Okumura |
| 2011/0308335 A1 | 12/2011 | Pink et al. |
| 2012/0038348 A1 | 2/2012 | Aimuta et al. |
| 2012/0056575 A1 | 3/2012 | Dial |
| 2012/0076626 A1 | 3/2012 | Hoey et al. |
| 2012/0098381 A1 | 4/2012 | Seki et al. |
| 2012/0223597 A1 | 9/2012 | Hosek et al. |
| 2013/0009579 A1 | 1/2013 | Henderson et al. |
| 2013/0014605 A1 | 1/2013 | Caveney |
| 2013/0026764 A1 | 1/2013 | Hayashi et al. |
| 2013/0026864 A1 | 1/2013 | Bae et al. |
| 2013/0028700 A1 | 1/2013 | Gilchrist et al. |
| 2013/0033219 A1 | 2/2013 | Kakimoto et al. |
| 2013/0057263 A1 | 3/2013 | Hosek |
| 2013/0069450 A1 | 3/2013 | Hosek et al. |
| 2013/0076177 A1 | 3/2013 | Seok |
| 2013/0085002 A1 | 4/2013 | Hosek |
| 2013/0088111 A1 | 4/2013 | Park |
| 2013/0099707 A1 | 4/2013 | Okubo |
| 2013/0134912 A1 | 5/2013 | Khalil et al. |
| 2013/0175904 A1 | 7/2013 | Jang et al. |
| 2013/0193812 A1 | 8/2013 | Oishi |
| 2013/0249543 A1 | 9/2013 | Lee |
| 2014/0002001 A1 | 1/2014 | Kinashi |
| 2014/0150592 A1 | 6/2014 | Kremerman |
| 2014/0167662 A1 | 6/2014 | Ajima et al. |
| 2014/0246893 A1 | 9/2014 | Tesar |
| 2015/0171709 A1 | 6/2015 | Ito et al. |
| 2015/0331052 A1 | 11/2015 | Seeley et al. |
| 2015/0346292 A1 | 12/2015 | Wang et al. |
| 2015/0346717 A1 | 12/2015 | Hosek et al. |
| 2016/0161561 A1 | 6/2016 | Chen et al. |
| 2020/0067368 A1* | 2/2020 | Moura ................ H02K 1/24 |

FOREIGN PATENT DOCUMENTS

| | | |
|---|---|---|
| CN | 101662257 | 3/2010 |
| CN | 102027658 | 4/2011 |
| CN | 102457149 | 5/2012 |
| CN | 103036332 | 4/2013 |
| CN | 103219856 | 7/2013 |
| DE | 102007034636 | 11/2007 |
| EP | 0756373 | 1/1997 |
| JP | 02206389 | 8/1990 |
| JP | 02206391 | 8/1990 |
| JP | 03145958 | 6/1991 |
| JP | 03277148 | 12/1991 |
| JP | 04046781 | 2/1992 |
| JP | 089676 | 1/1996 |
| JP | 08119409 | 5/1996 |
| JP | 08256455 | 10/1996 |
| JP | 09294393 | 11/1997 |
| JP | 10170212 | 6/1998 |
| JP | 11318063 | 11/1999 |
| JP | 2001050161 | 2/2001 |
| JP | 2001112223 | 4/2001 |
| JP | 2001221359 | 8/2001 |
| JP | 2001255220 | 9/2001 |
| JP | 2002027785 | 1/2002 |
| JP | 2002059386 | 2/2002 |
| JP | 2002066976 | 3/2002 |
| JP | 2003039376 | 2/2003 |
| JP | 2003229128 | 8/2003 |
| JP | 2003339128 | 11/2003 |
| JP | 2004023890 | 1/2004 |
| JP | 2004242444 | 8/2004 |
| JP | 2005037389 | 2/2005 |
| JP | 2005124309 | 5/2005 |
| JP | 2006094577 | 4/2006 |
| JP | 2006162557 | 6/2006 |
| JP | 2006284299 | 10/2006 |
| JP | 2006529081 | 12/2006 |
| JP | 2007097257 | 4/2007 |
| JP | 2007151269 | 6/2007 |
| JP | 2008537472 | 9/2008 |
| JP | 2009142101 | 6/2009 |
| JP | 10052002 | 3/2010 |
| JP | 2010052002 | 3/2010 |
| JP | 2010183806 | 8/2010 |
| JP | 2010532154 | 9/2010 |
| KR | 1020050002151 | 7/2005 |
| WO | 0064028 | 10/2000 |
| WO | 2003021761 | 3/2003 |
| WO | 2008081684 | 7/2008 |
| WO | 2009003193 | 12/2008 |
| WO | 2009003196 | 12/2008 |
| WO | 2009012396 | 1/2009 |
| WO | 2009018149 | 2/2009 |
| WO | 2011139682 | 11/2011 |
| WO | 2013040406 | 3/2013 |

OTHER PUBLICATIONS

International Search Report, International Application No. PCT/US2014/065414, dated Feb. 27, 2015.

International Search Report, International Application No. PCT/US2014/065422, dated Feb. 26, 2015.

International Search Report, International Application No. PCT/US2014/065432, dated Feb. 24, 2015.

TW_IPO_Search_Report Aplication No. 10313929 dated Sep. 12, 2018.

* cited by examiner

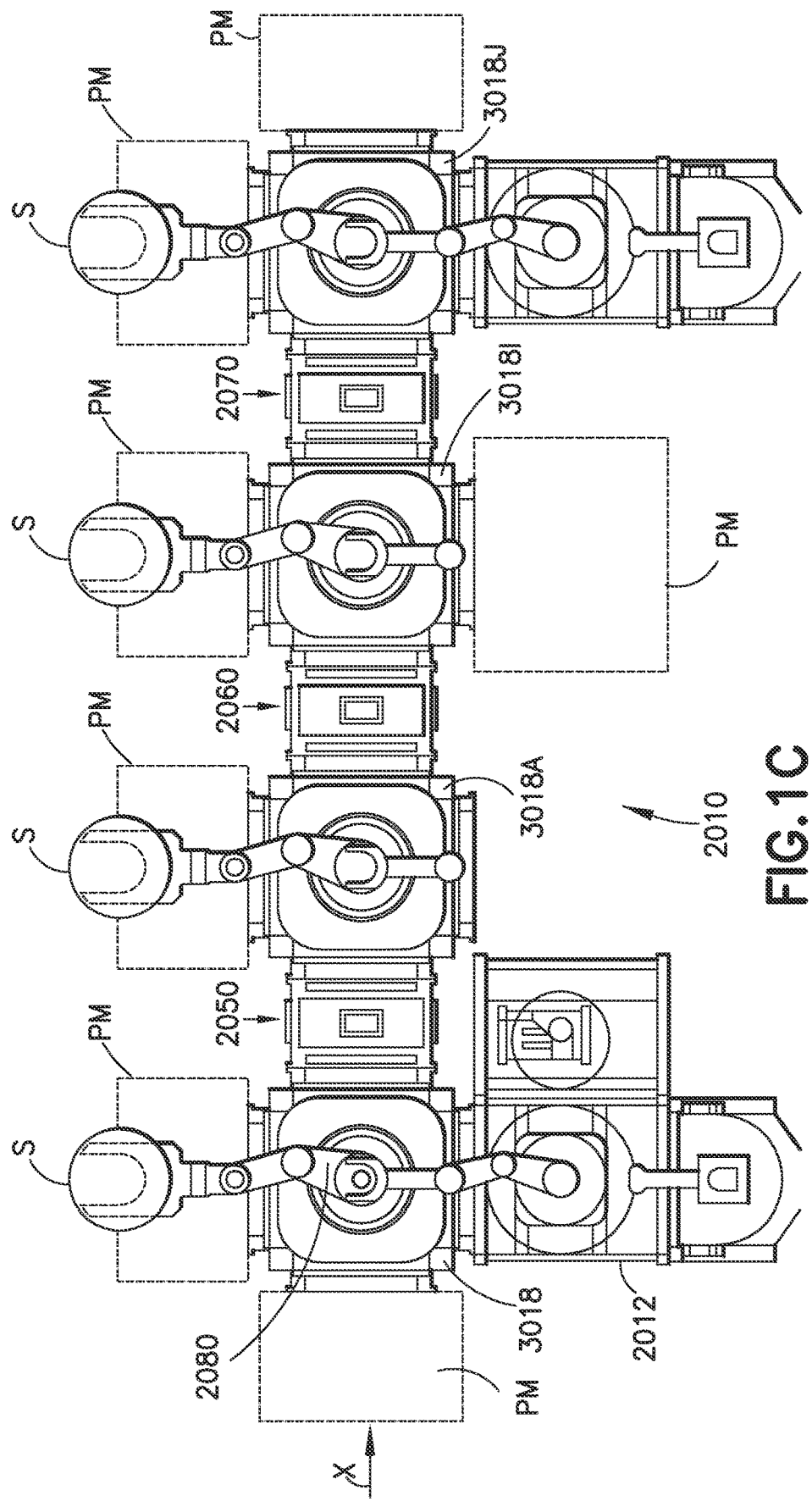

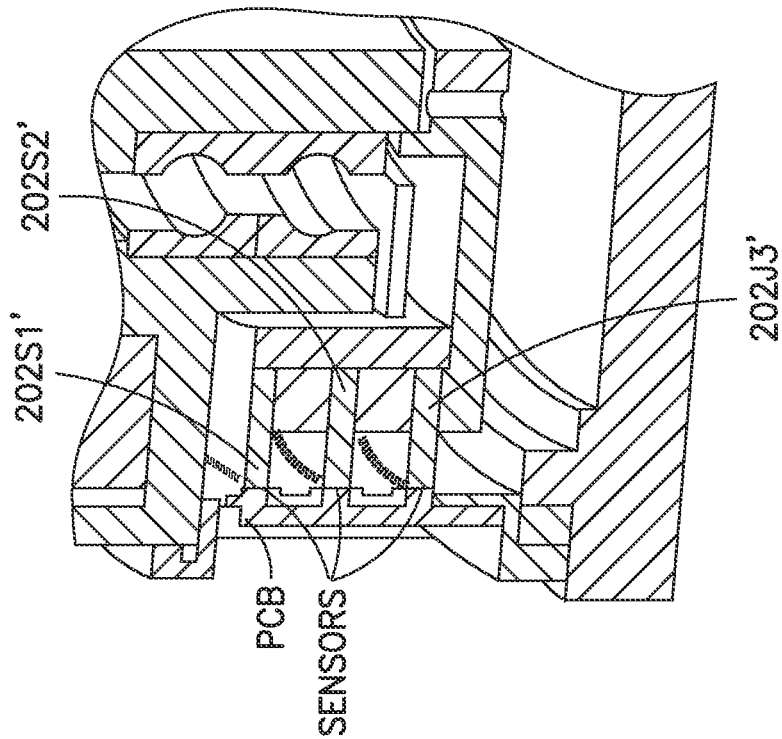
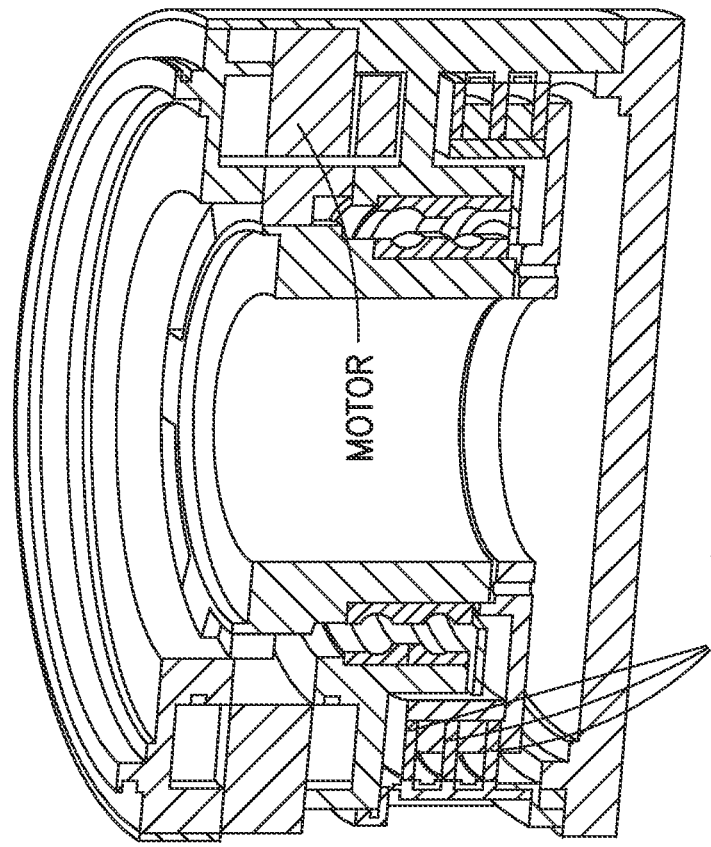

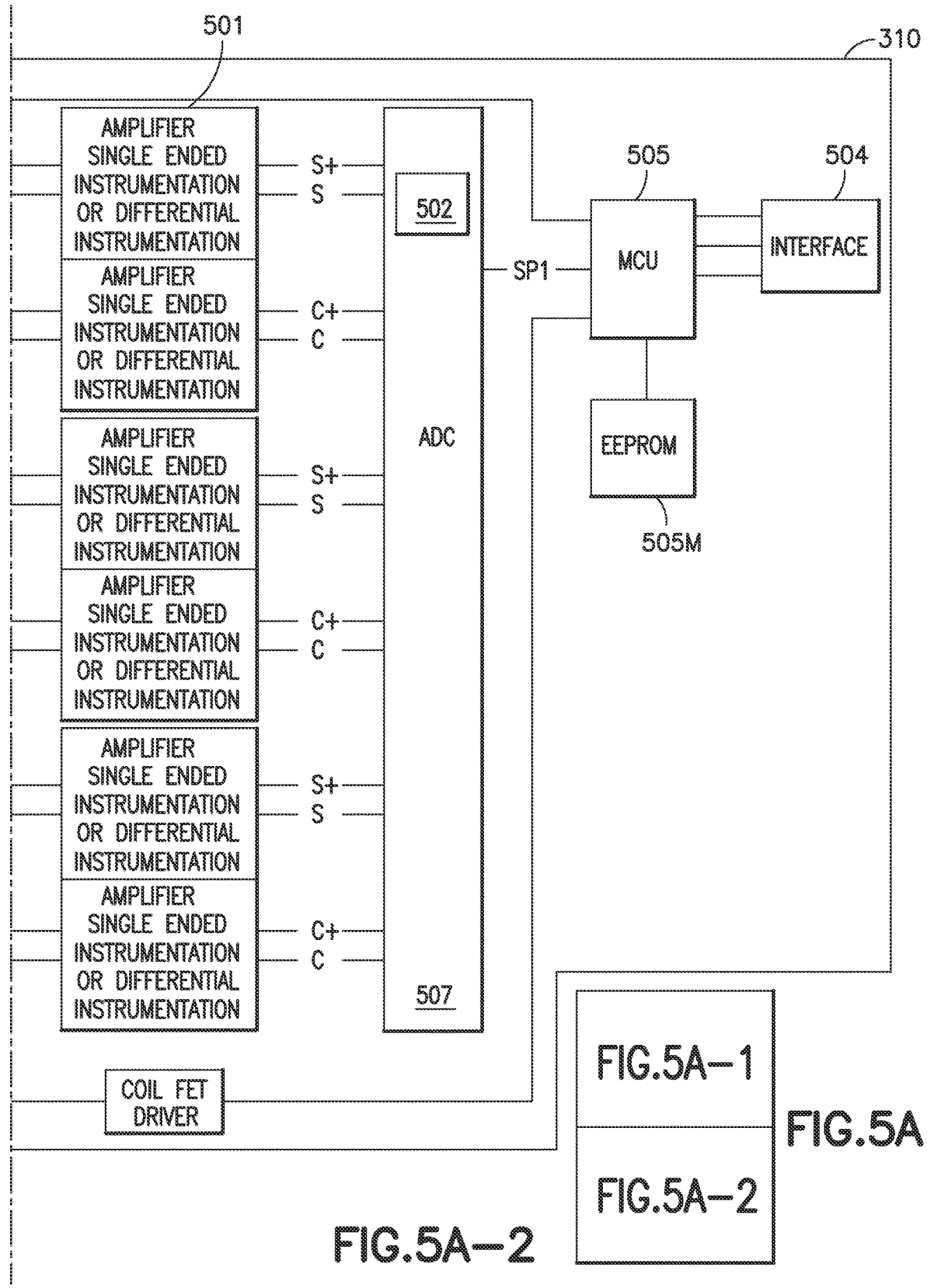

POSITION FEEDBACK FOR SEALED ENVIRONMENTS

CROSS-REFERENCE TO RELATED APPLICATIONS

This application is a continuation of U.S. application Ser. No. 16/838,785, filed Apr. 2, 2020 (Now U.S. Pat. No. 11,404,939, issued Aug. 2, 2022) which is a continuation of U.S. patent application Ser. No. 14/540,058 filed Nov. 13, 2014 (Now U.S. Pat. No. 10,742,092, issued Aug. 11, 2020), which is a non-provisional of and claims the benefit of U.S. provisional patent application No. 61/903,726 filed on Nov. 13, 2013, the disclosures of which are incorporated herein by reference in their entireties.

BACKGROUND

1. Field

The exemplary embodiments generally relate to position feedback and, more particularly, to position feedback for sealed robotic drives.

2. Brief Description of Related Developments

Generally, existing direct drive technology, which for example uses permanent magnet motors or variable reluctance motors for actuation and optical encoders for position sensing, exhibits considerable limitations when, for example, the magnets, bonded components, seals and corrosive materials of the direct drive are exposed to ultra-high vacuum and/or aggressive and corrosive environments. To limit exposure of, for example, the magnets, bonded components, electrical components, seals and corrosive materials of the direct drive a "can-seal" is generally used.

The can-seal generally isolates a motor rotor from a corresponding motor stator via a hermetically sealed non-magnetic wall or "can", also known as an "isolation wall". Can-seals generally use a non-magnetic vacuum isolation wall that is located between the rotor and stator of a given motor actuator. As a result, the stator can be completely located outside the sealed environment. This may allow for substantially clean and reliable motor actuation implementations in applications such as vacuum robot drives used for semiconductor applications. However, the sensors or encoders may include electronic components that may be located within the sealed environment where the electronic components may be a potential contamination source and where the sealed environment subjected the electronic components to corrosion. As may be realized, hermetically sealed connectors are required for the electronic components within the sealed environment so that wires or other signal carrying medium can be routed through the isolation wall. As may be realized, these hermetically sealed connectors may be a potential leak source. Further, in the case of optical sensors, contaminants or particulates may be deposited on the feedback track (or scale) and can lead to signal degradation and sensor failure. In other aspects, windows may be provided through which the sensors operate however these windows may also be a source of leaks.

It would be advantageous to have a position feedback system that is operative through an isolation wall between an isolated or otherwise sealed environment and an environment outside the sealed environment such that the above-described issues are addressed.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of processing apparatus incorporating aspects of the disclosed embodiment;

FIGS. 2E-2F are respectively cross-section perspective and enlarged cross-section illustrating further features;

FIGS. 5, 5A-1, and 5A-2 are schematic illustrations of a sensor in accordance with aspects of the disclosed embodiment;

DETAILED DESCRIPTION

Referring to FIGS. 1A-1D, there are shown schematic views of substrate processing apparatus or tools incorporating the aspects of the disclosed embodiment as disclosed further herein. Although the aspects of the disclosed embodiment will be described with reference to the drawings, it should be understood that the aspects of the disclosed embodiment can be embodied in many forms. In addition, any suitable size, shape or type of elements or materials could be used.

Figure 1A:
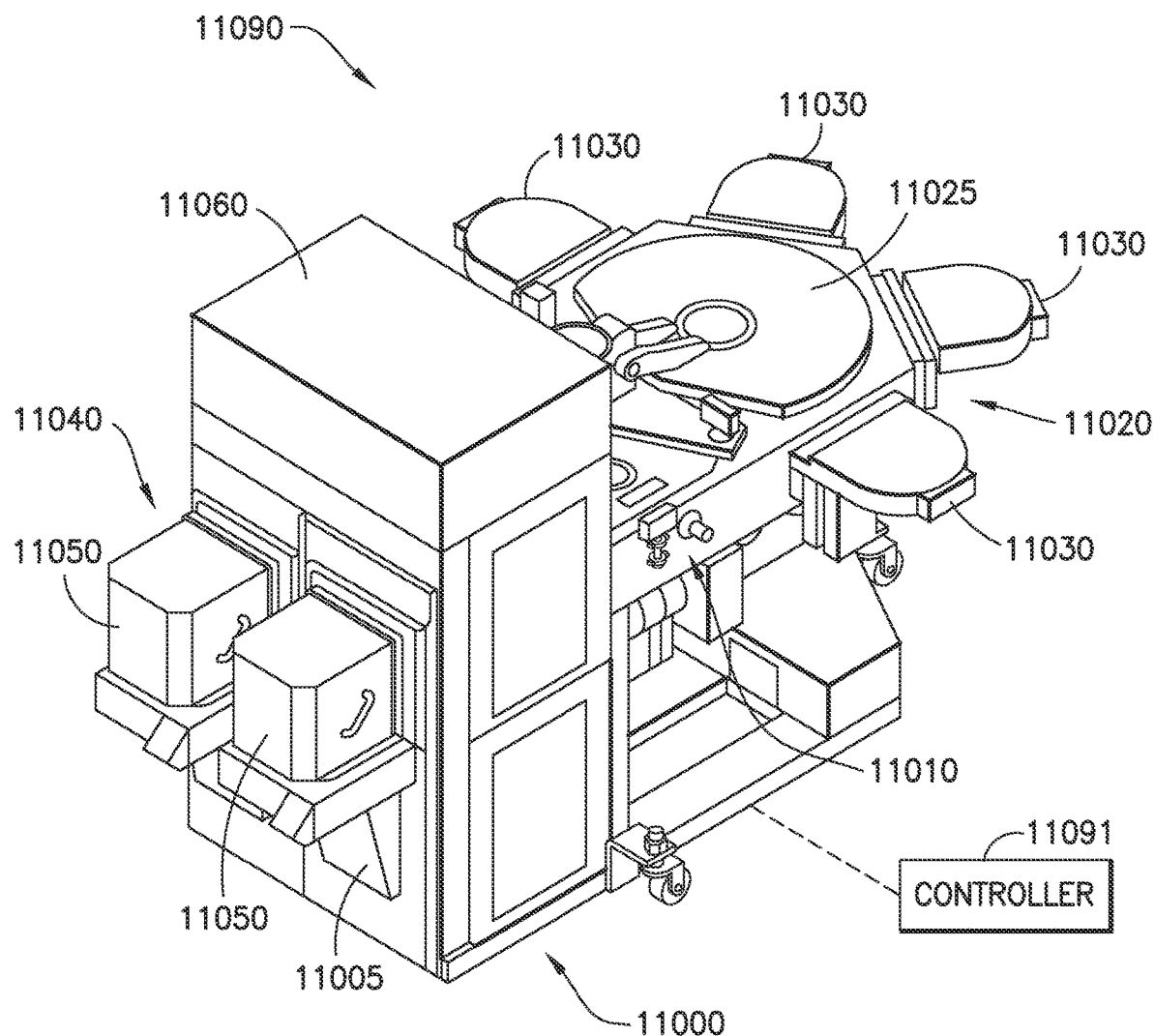
Figure 1B:
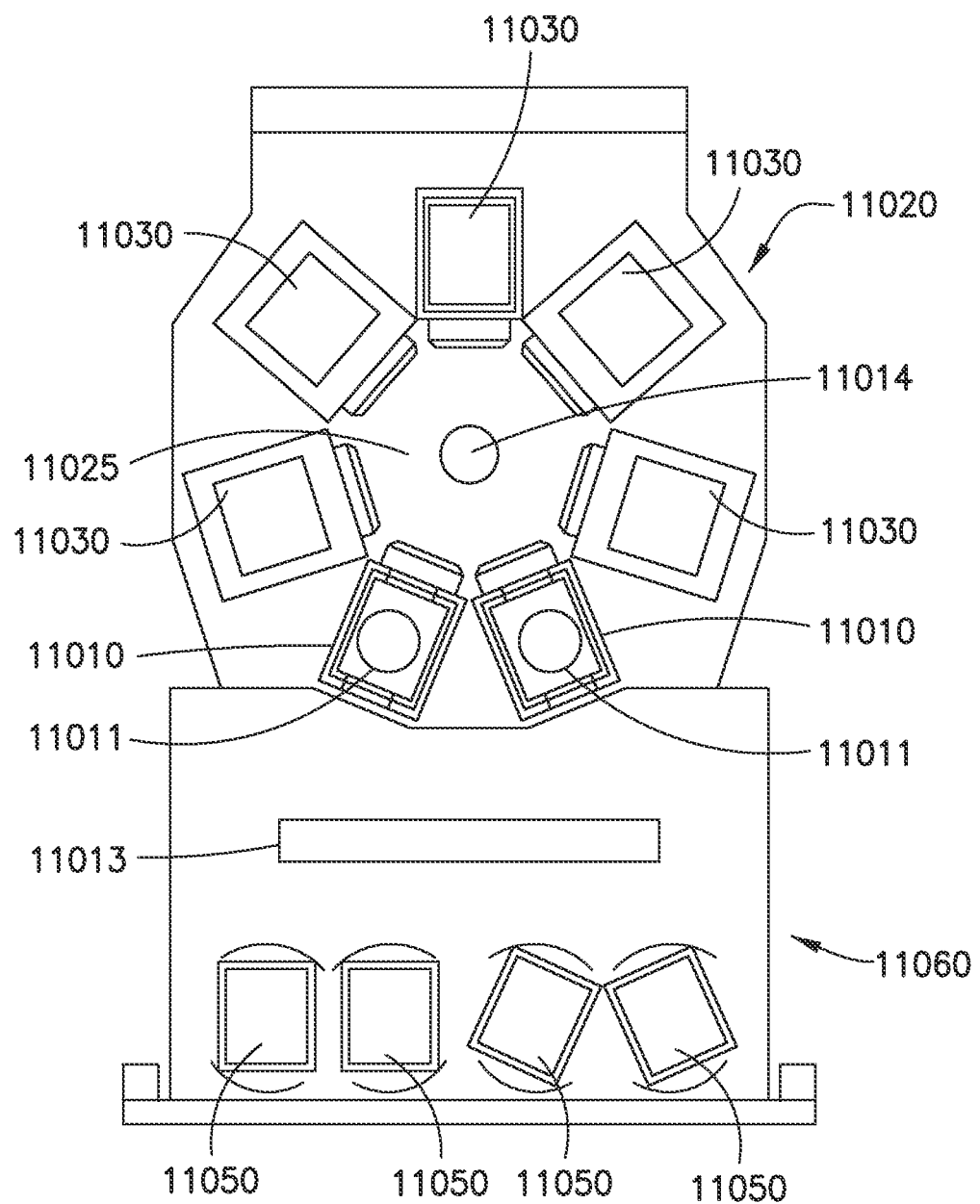

Referring to FIGS. 1A and 1B, a processing apparatus, such as for example a semiconductor tool station 11090 is shown in accordance with an aspect of the disclosed embodiment. Although a semiconductor tool is shown in the drawings, the aspects of the disclosed embodiment described herein can be applied to any tool station or application employing robotic manipulators. In this example the tool 11090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety. The tool station 11090 generally includes an atmospheric front end 11000, a vacuum load lock 11010 and a vacuum back end 11020. In other aspects, the tool station may have any suitable configuration. The components of each of the front end 11000, load lock 11010 and back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 11000 generally includes load port modules 11005 and a mini-environment 11060 such as for example an equipment front end module (EFEM). The load port modules 11005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer interfaces or any other suitable substrate interfaces such as for example larger or smaller wafers or flat panels for flat panel displays. Although two load port modules are shown in FIG. 1A, in other aspects any suitable number of load port modules may be incorporated into the front end 11000. The load port modules 11005 may be configured to receive substrate carriers or cassettes 11050 from an overhead transport system, automatic guided vehicles, person guided vehicles, rail guided vehicles or from any other suitable transport method. The load port modules 11005 may interface with the mini-environment 11060 through load ports 11040. The load ports 11040 may allow the passage of substrates between the substrate cassettes 11050 and the mini-environment 11060. The mini-environment 11060 generally includes any suitable transfer robot 11013 which may incorporate one or more aspects of the disclosed embodiment described herein. In one aspect the robot 11013 may be a track mounted robot such as that described in, for example, U.S. Pat. No. 6,002,840, the disclosure of which is incorporated by reference herein in its entirety. The mini-environment 11060 may provide a controlled, clean zone for substrate transfer between multiple load port modules.

The vacuum load lock 11010 may be located between and connected to the mini-environment 11060 and the back end 11020. It is noted that the term vacuum as used herein may denote a high vacuum such as $10^{-5}$ Torr or below in which the substrate are processed. The load lock 11010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. The load lock 11010 may also include an aligner 11011 for aligning a fiducial of the substrate to a desired position for processing. In other aspects, the vacuum load lock may be located in any suitable location of the processing apparatus and have any suitable configuration.

The vacuum back end 11020 generally includes a transport chamber 11025, one or more processing station(s) 11030 and any suitable transfer robot 11014 which may include one or more aspects of the disclosed embodiments described herein. The transfer robot 11014 will be described below and may be located within the transport chamber 11025 to transport substrates between the load lock 11010 and the various processing stations 11030. The processing stations 11030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow substrates to be passed from the transport chamber 11025 to the processing stations 11030 and vice versa.

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3019A, 3018I, 3018J includes any suitable substrate transport 2080, which may include one or more aspects of the disclosed embodiment described herein, for transporting substrates throughout the processing system 2010 and into and out of, for example, processing modules PM. As may be realized, each chamber module may be capable of holding an isolated or controlled atmosphere (e.g. N2, clean air, vacuum).

Figure 1D:
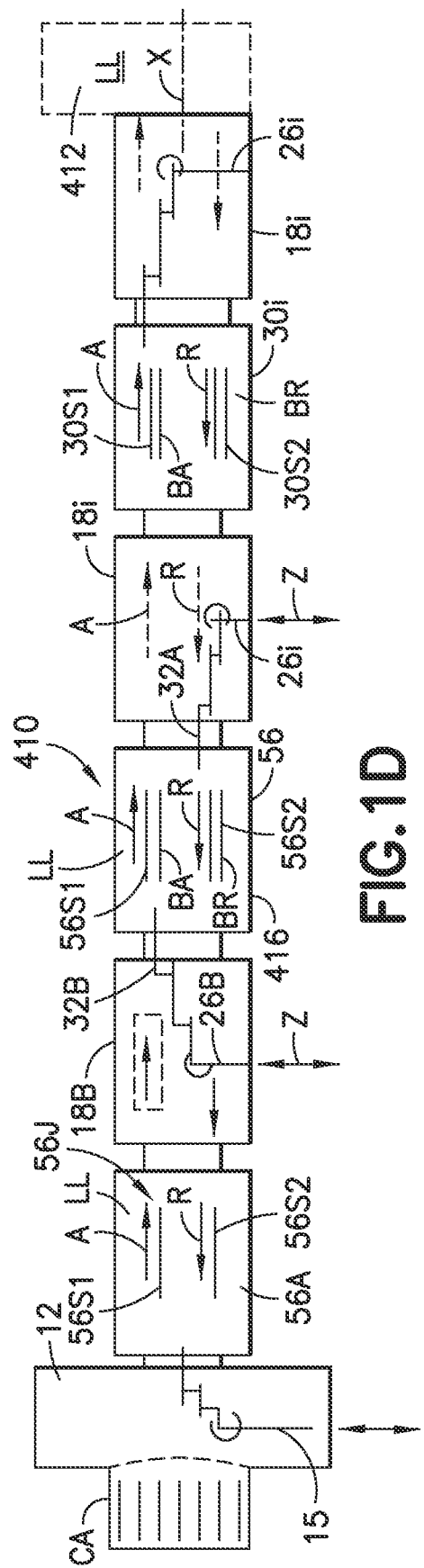

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56B and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock. As also noted before, transport chamber modules 18B, 18i have one or more corresponding transport apparatus 26B, 26i, which may include one or more aspects of the disclosed embodiment described herein, located therein. The transport apparatus 26B, 26i of the respective transport chamber modules 18B, 18i may cooperate to provide the linearly distributed workpiece transport system 420 in the transport chamber. In this aspect, the transport apparatus 26B may have a general SCARA arm configuration (though in other aspects the transport arms may have any other desired arrangement such as a frog-leg configuration, telescopic configuration, bi-symmetric configuration, etc.). In the aspect of the disclosed embodiment shown in FIG. 1D, the arms of the transport apparatus 26B may be arranged to provide what may be referred to as fast swap arrangement allowing the transport to quickly swap wafers from a pick/place location as will also be described in further detail below. The transport arm 26B may have a suitable drive section, such as described below, for providing each arm with any suitable number of degrees of freedom (e.g. independent rotation about shoulder and elbow joints with Z axis motion). As seen in FIG. 1D, in this aspect the modules 56A, 56, 30i may be located interstitially between transfer chamber modules 18B, 18i and may define suitable processing modules, load lock(s), buffer station(s), metrology station(s) or any other desired station(s). For example the interstitial modules, such as load locks 56A, 56 and workpiece station 30i, may each have stationary workpiece supports/shelves 56S, 56S1, 56S2, 30S1, 30S2 that may cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figure 2A:
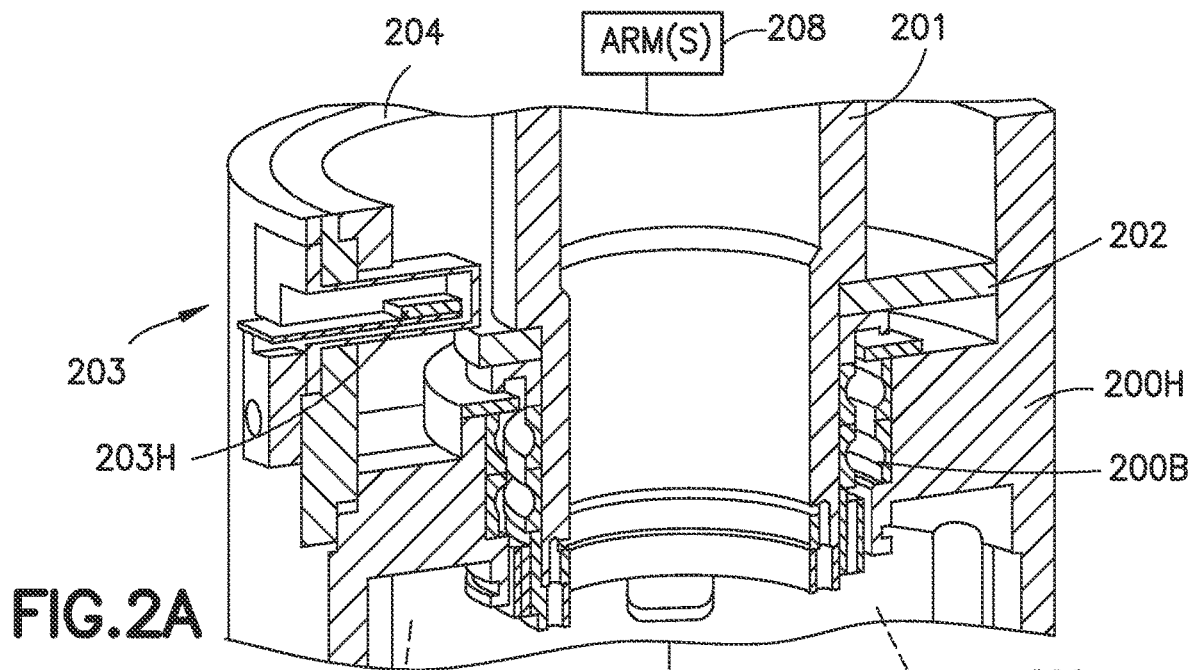
FIGS. 2A-2D are schematic illustrations of portions of transport apparatus in accordance with aspects of the disclosed embodiment.

Referring now to FIG. 2A, a schematic illustration of a portion of a transport apparatus drive 200 is illustrated. The transport drive may be employed in any suitable atmospheric or vacuum robotic transport such as those described above. The drive may include a drive housing 200H having at least one drive shaft 201 at least partially disposed therein. Although one drive shaft is illustrated in FIG. 2A in other aspects the drive may include any suitable number of drive shafts. The drive shaft 201 may be mechanically suspended or magnetically suspended within the housing 200H in any suitable manner. In this aspect the drive shaft is suspended within the housing with any suitable bearings 200B but in other aspects the drive shaft may be magnetically suspended (e.g. a self-bearing drive) in a manner substantially similar to that described in U.S. Pat. No. 8,283,813 entitled "Robot Drive with Magnetic Spindle Bearings" issued on Oct. 9, 2012, the disclosure of which is incorporated by reference herein in its entirety. Each drive shaft of the drive 200 may be driven by a respective motor 206 where each motor includes stator 206S and a rotor 206R. The exemplary embodiment depicted in the figures has what may be referred to as a rotary drive configuration that is illustrated for purposes of facilitating description and features of the various aspects, as shown and described herein. As may be realized the features of the various aspects illustrated with respect to the rotary drive configuration are equally applicable to a linear drive configuration. It is noted that the drive motors described herein may be permanent magnet motors, variable reluctance motors (having at least one salient pole with corresponding coil units and at least one respective rotor having at least one salient pole of magnetic permeable material), or any other suitable drive motors. The stator(s) 206S may be fixed at least partly within the housing and the rotor(s) 206R may be fixed in any suitable manner to a respective drive shaft 201. In one aspect, the stator(s) 206S may be located in an "external" or "non-sealed" environment that is sealed from an atmosphere in which the robot arm(s) 208 operate (the atmosphere in which the robot arm(s) operate is referred to herein as a "sealed" environment which may be a vacuum or any other suitable environment) through the employment of an isolation wall or barrier while the rotor(s) 206R is located within the sealed environment in a manner substantially similar to that described in U.S. provisional patent having U.S. application No. 61/903,813 entitled "SEALED ROBOT DRIVE" and filed on Nov. 13, 2013, the disclosure of which is incorporated by reference herein in its entirety and as will be described in greater detail below. It is noted that the terms non-ferromagnetic separation wall, seal partition or isolation wall (which will be described in greater detail below) as used herein refer to a wall made of any suitable non-ferromagnetic material that may be disposed between the moving parts of the robot drive and/or sensor and the corresponding stationary parts of the robot drive and/or sensor.

In one aspect the housing 200H of the drive 200 has a substantially drum shaped configuration (e.g. a drum structure) having an exterior 200HE and an interior 200HI. The housing 200H, in one aspect, is an unitary one piece monolithic structure while, in other aspects, the housing 200H is an integral assembly having two or more hoops fastened together in any suitable manner so as to form the drum structure of the housing 200H. The interior 200HI of the housing includes a stator interface surface 200HS in which the stator 206S of the variable reluctance motor 206 is located. The stator interface surface 200HS (and hence the housing 200H) is configured to provide rigidity and support for the stator 206S. As may be realized, the stator interface surface 200HS (and hence the housing 200H) is a datum surface that positions the stator 206S (and isolation wall 204 which in one aspect is supported by the stator so that the stator is located in an atmospheric environment separate from the vacuum environment in which the rotor is located) to control a gap between the stator 206S and rotor 206R. The housing 200H also includes a rotor interface surface 200HR that interfaces with and positions the rotor 206R (e.g. the bearings 200B are positioned on the drive shaft 201/rotor 206R in a predetermined position and the bearings 200B interface with the rotor interface surface 200HR) so that the rotor 206R is positioned in a predetermined position relative to the stator 206S. As may be realized, the stator interface surface 200HS is a datum surface for the rotor interface surface 200HR (and hence the rotor 206R/drive shaft 201) so that the rotor 206R (and drive shaft 201 connected thereto) and the stator 206S are positioned relative to and depend from a common datum formed by the housing 200H. In one aspect the housing 200H includes a control board aperture or slot PCBS formed in the housing 200H and into which one or more printed circuit boards PCB (similar to PCB 310 described below which include sensor 203 that interfaces with the sensor or encoder track 202 described below) located in the atmospheric environment and separated from the sensor track 202 (which is located in the vacuum environment) by a vacuum barrier in a manner similar to that described below. The control board aperture PCBS includes a sensor interface surface 200HT that positions the sensor 203 relative to the stator interface surface 200HS (e.g. the common datum of the housing 200H) in a predetermined position. As may be realized, the sensor track 202 is connected to the rotor 206R so that the sensor track 202 is located in a predetermined location relative to the rotor interface surface 200HR. As such, the relative positioning of the sensor interface surface 200HT and the rotor interface surface 200HR with the stator interface surface 200HS positions and controls the gap between the sensor 203 and the sensor track 202 where the stator 206S, the rotor 206R, the sensor 203 and the sensor track 202 are positioned relative to and dependent from the common datum. In one aspect, the housing 200H includes any suitable slot or aperture MLS through which any suitable drive connectors CON pass for providing power and control signals to (and feedback signals from) the drive 200.

Figure 2B:
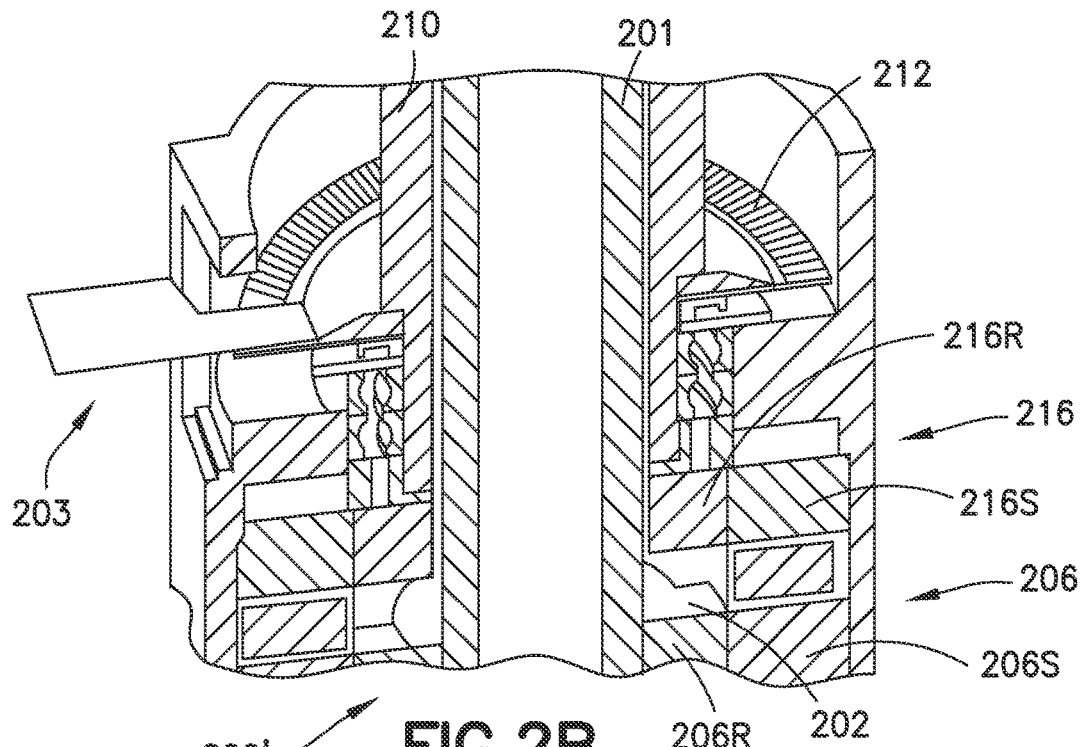
Figure 2C:
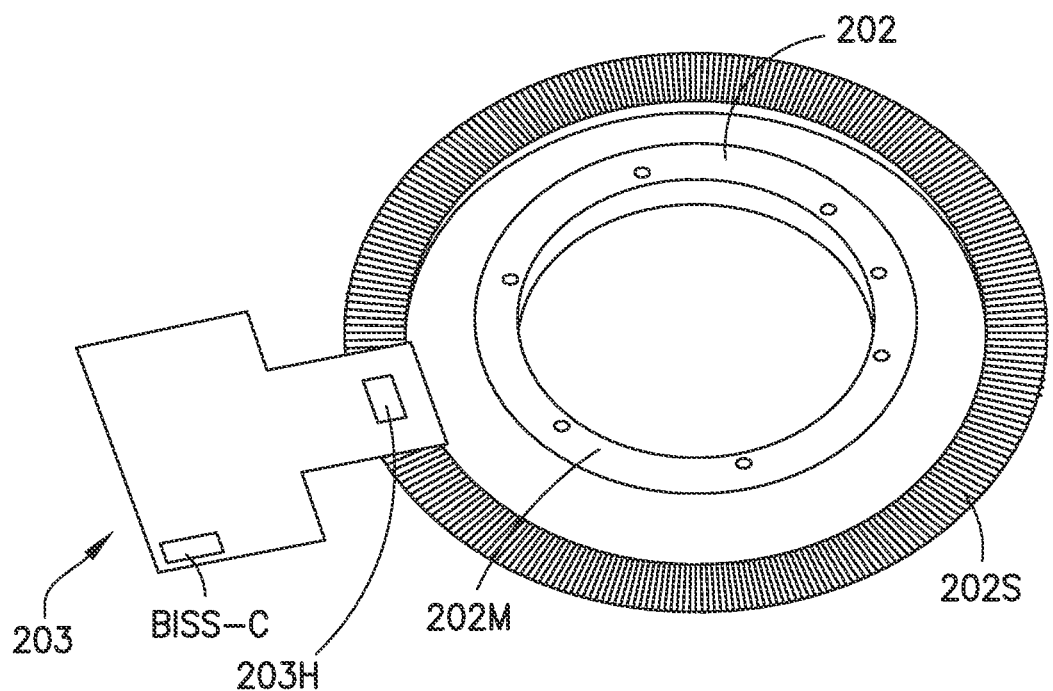
Figure 2D:
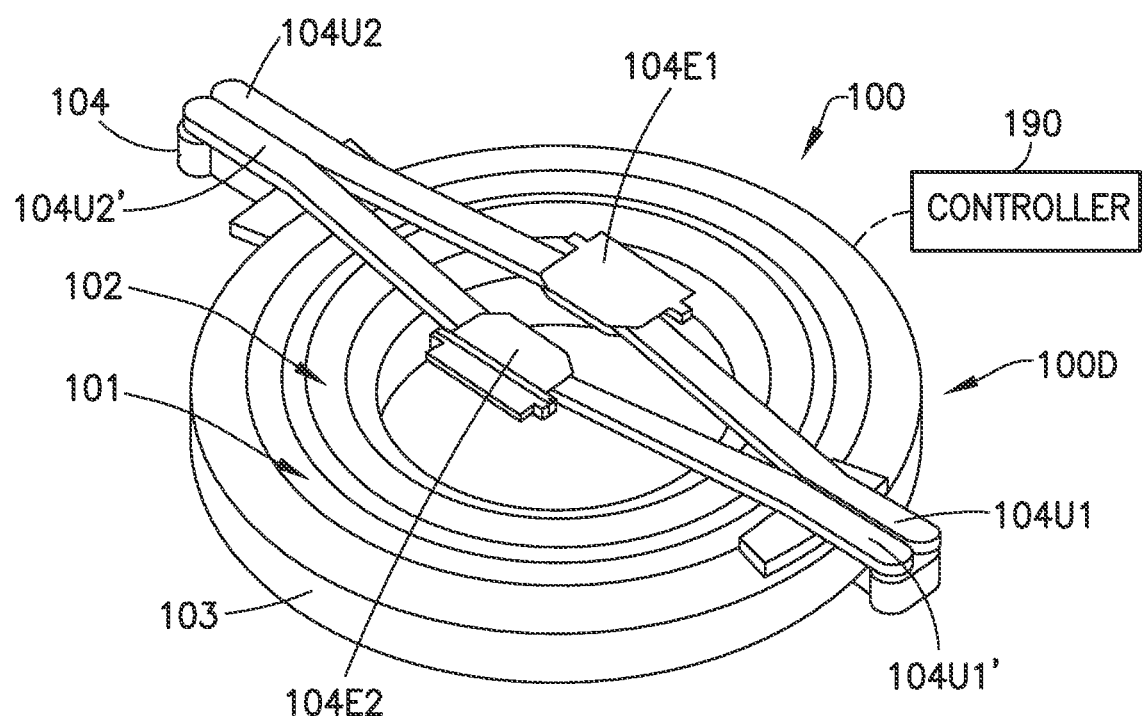
Figure 2G:
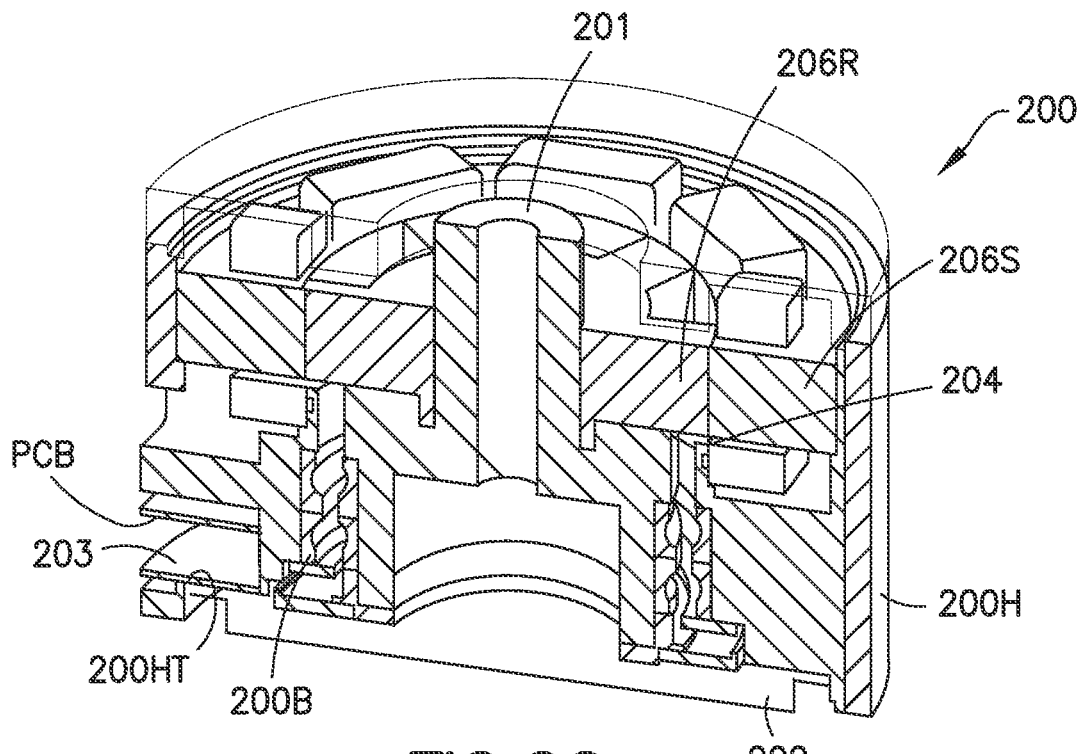
FIGS. 2G-2K are schematic illustrations of a drive section in accordance with aspects of the disclosed embodiment.
Figure 2H:
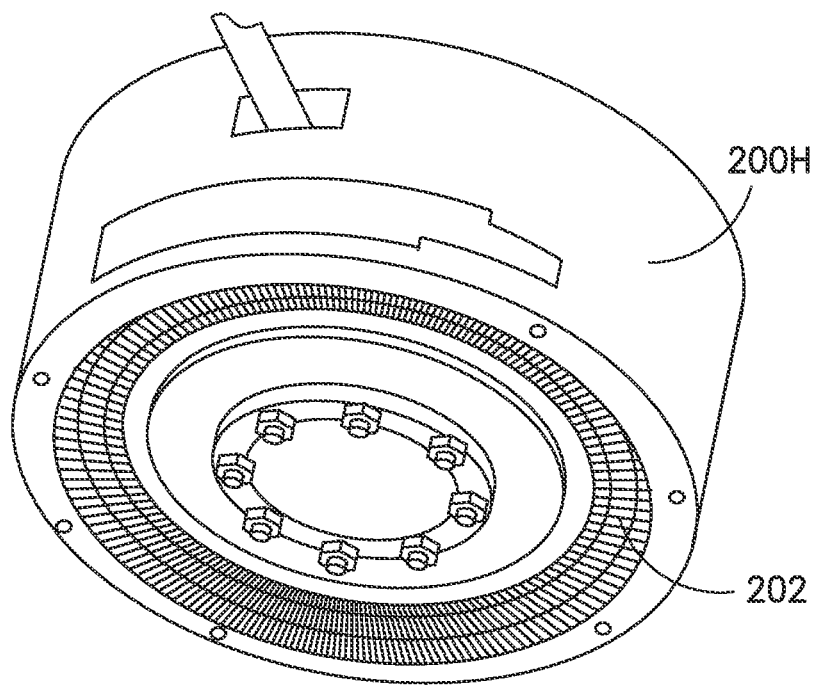
Figure 2I:
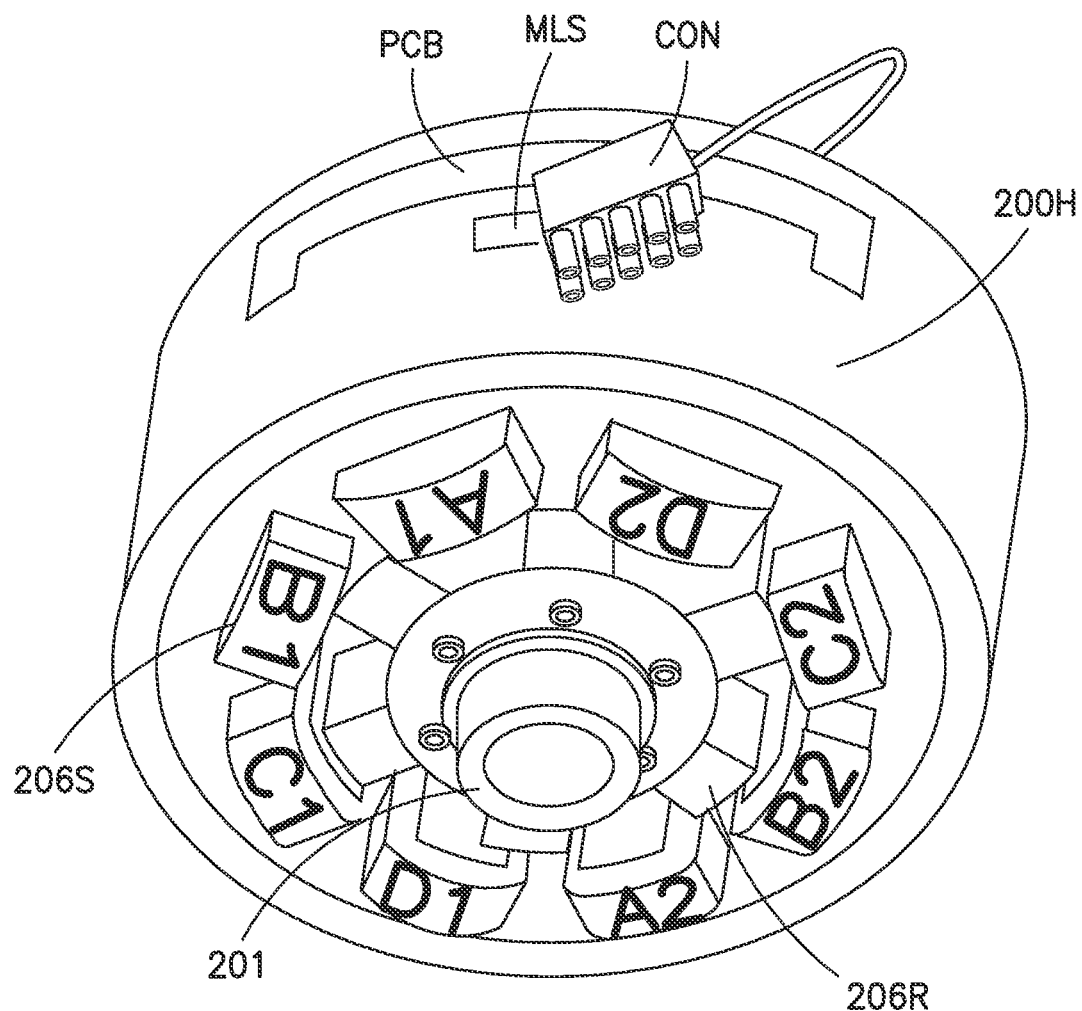
Figure 2J:
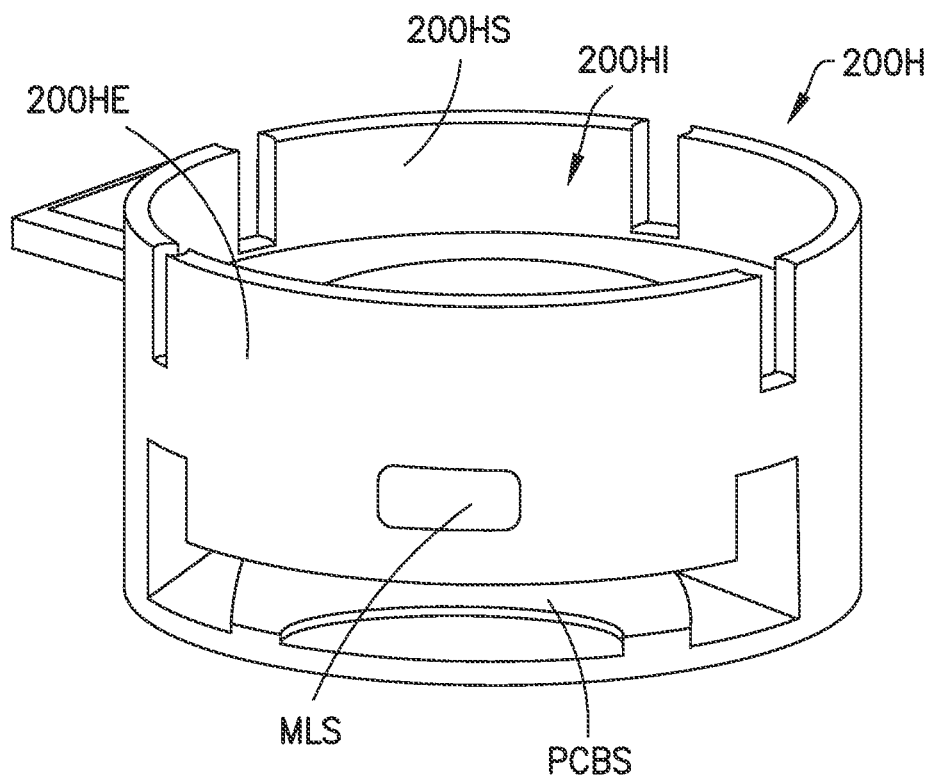
Figure 2K:
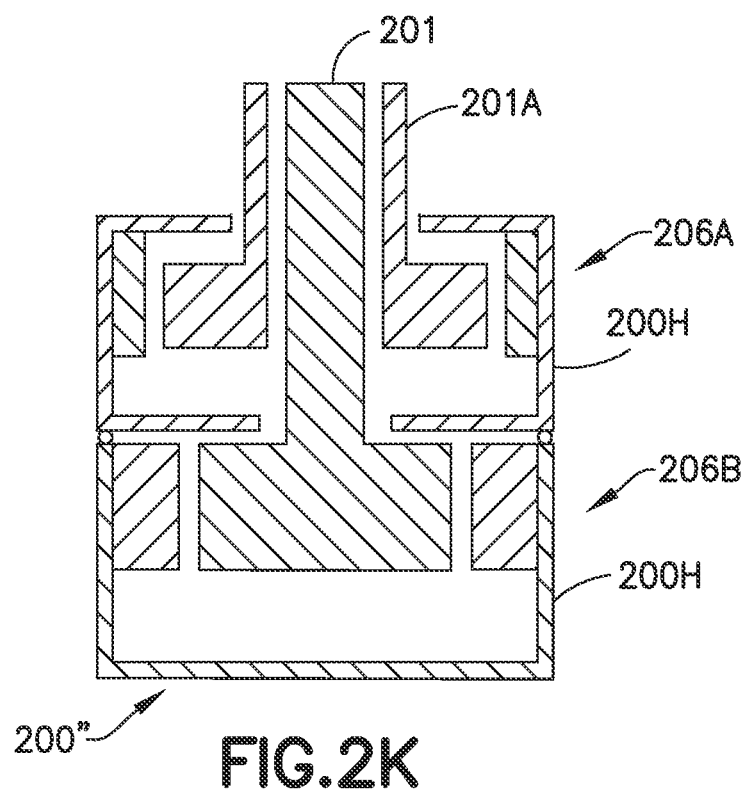

Referring to FIG. 2K, it should be understood that while FIGS. 2G-2J illustrate a drive having a single drive shaft 201 for exemplary purposes only, in other aspects the drive includes any suitable number of motors having any suitable corresponding number of drive shafts. For example, FIG. 2K illustrates a drive 200" having two motors 206A, 206B arranged in a stacked or in-line configuration. Here each motor 206A, 206B includes a respective housing 200H (substantially similar to that described above) where the housings are connected to each other in any suitable manner to form the multiple motor (e.g. multiple degree of freedom) drive 200" so that a drive shaft 201 of motor 206B extends through an aperture in a drive shaft 201A of motor 206A to form a coaxial drive spindle.

Referring also to FIG. 2B, a transport apparatus drive 200' substantially similar to drive 200 is illustrated having a coaxial drive shaft arrangement with two drive shafts 201, 210. In this aspect the drive shaft 201 is driven by motor 206 (having stator 206S and rotor 206R) while shaft 210 is driven by motor 216 (having stator 216S and rotor 216R). Here the motors are shown in a stacked arrangement (e.g. in line and arranged one above or one in front of the other). However, it should be understood that the motors 206, 216 may have any suitable arrangement such as a side by side or concentric arrangement. For example, referring to FIG. 2D, in one aspect the substrate transport apparatus 100 is shown as having a low profile planar or "pancake" style robot drive configuration where the motors are concentrically nested within each other in a manner substantially similar to that described in U.S. Pat. No. 8,008,884 entitled "Substrate Processing Apparatus with Motors Integral to Chamber Walls" issued on Aug. 30, 2011 and U.S. Pat. No. 8,283,813 entitled "Robot Drive with Magnetic Spindle Bearings" issued on Oct. 9, 2012, the disclosures of which are incorporated by reference herein in their entireties. The substrate transport apparatus 100 may include a reluctance drive 100D having one or more stators and corresponding rotors (which in this aspect include an outer rotor 101 and an inner rotor 102). The rotors 101, 102 may be actuated by their respective stators through an enclosure or isolation wall 103 based on any suitable reluctance motor principle. It is noted that due to, for example, the comparatively large rotor diameters and high torque capabilities the pancake style drive configurations may offer a direct drive alternative to harmonic drive robots for high/heavy payload applications. In other aspects any suitable harmonic drive may be coupled to an output of the motors described herein for driving one or more robotic arms. The pancake style drive configurations may also allow for a hollow central drive section which can accommodate a vacuum pump inlet and/or support partial or full integration of vacuum pumping arrangement within the robot drive, such as in compact vacuum chambers with limited space around the robot drive or any other suitable chamber in which the robot drive is at least partially disposed.

The drives described herein may carry any suitable robot arm 104 (as noted above) configured to transport, for example, semiconductor wafers, flat panels for flat panel displays, solar panels, reticles or any other suitable payload. In this aspect the robot arm 104 is illustrated as a bi-symmetric type robot arm (e.g. having opposing end effectors that are linked in extension and retraction) where one of the upper arms 104U1, 104U1' is attached to the outer rotor 101 and the other upper arm 104U2, 104U2" is attached to the inner rotor 102. In other aspects, any suitable number and type of robot arms may be attached to the drive motor arrangements described herein. In addition to the bi-symmetric arm 104 other examples of arm configurations that may be employed with the pancake type motor arrangements or the stacked motor arrangements include, but are not limited to, the arm configurations described in U.S. patent application Ser. No. 12/117,415 entitled "Substrate Transport Apparatus with Multiple Movable Arms Utilizing a Mechanical Switch Mechanism" filed on May 8, 2008, the disclosure of which is incorporated by reference herein in its entirety. For example, the arms may be derived from a conventional SCARA (selective compliant articulated robot arm)-type design, which includes an upper arm, a band-driven forearm and a band-constrained end-effector, by eliminating the upper arm, a telescoping arm or any other suitable arm design.

The operation of the arms may be independent from each other (e.g. the extension/retraction of each arm is independent from other arms), may be operated through a lost motion switch or may be operably linked in any suitable way such that the arms share at least one common drive axis. As an example, a radial extension move of the either end effector 104E1, 104E2 of the bi-symmetric arm can be performed by substantially simultaneously rotating the outer rotor 101 and inner rotor 102 in opposite directions substantially at the same rate. Rotation of the arm 104 as a unit can be performed by rotating the outer rotor 101 and inner rotor 102 in the same direction as substantially the same rate.

Referring again to FIGS. 2A and 2B and also to FIG. 2C, each drive shaft 201 may also have mounted thereto a sensor or encoder track 202 with a position determining indicia or features that interface with a sensor 203. It is noted that the sensors described herein may be configured such that the read head portion of the sensor 203 (e.g. the portion of the sensor to which a sensing member is mounted) are modules that can be inserted and removed from the drive housing or isolation wall 204 (it is noted that the isolation wall 204 may be a common isolation wall that also seals the drive stators from the sealed environment). The sensor 203 may be fixed at least partly within the housing 200H in any suitable manner that allows sensing elements or members 203H of the sensor 203 to read or otherwise be influenced by one or more scales 202S (which will be described below) for providing position signals to any suitable controller such as motion controller 190 (which may be substantially similar to controller 11091 described above). In one aspect at least a portion of the sensor 203 may be located in the external environment and sealed or otherwise isolated from the sealed environment with the isolation wall 204 as will be described in greater detail below so that the sensor electronics and/or magnets are disposed in the external environment while the sensor track is disposed in the sealed environment. The sealed environment may be difficult to monitor directly due to, for example, harsh environmental conditions, such as vacuum environments or environments with extreme temperatures. The aspects of the disclosed embodiments described herein provide non-intrusive position measurement of a moving object (e.g. such as a motor rotor, a robot arm connected to the motor or any other suitable object) within the sealed environment.

Figure 3:
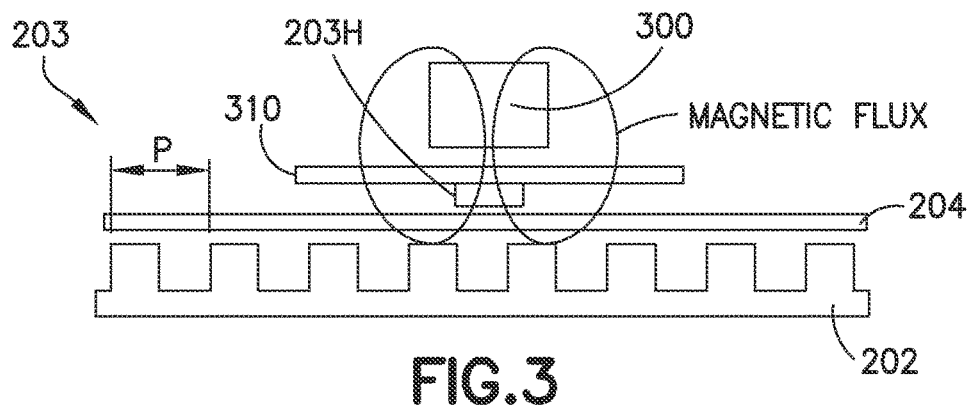
FIG. 3 is a schematic illustration of a portion of a position sensor in accordance with aspects of the disclosed embodiment.

In one aspect, referring to FIG. 3, the sensor 203 may utilize magnetic circuit principles to detect the position of the encoder track 202 where the encoder track has at least one encoder scale (e.g. where each of the at least one encoder scale has a predetermined pitch that may be different than a pitch of other ones of the at least one encoder scale) located within the sealed environment. The magnetic sensing system illustrated in FIG. 3 is shown in a representative manner and may be configured as a Giant Magneto Resistive sensor (GMR) or as a differential type GMR (i.e. that senses the gradient field differential between several locations, otherwise referred to as a gradiometer) as will be described below. The sensor may include at least one magnetic or ferromagnetic source 300, the ferromagnetic encoder track 202, and at least one magnetic sensing element or member 203H (corresponding to each magnetic source) disposed substantially between the magnetic source and the ferromagnetic track.

The encoder track may be configured so that the track width (e.g. track face with encoding features thereon) may extend in a plane extending radially outwards with the position encoding features varying orthogonally from the track plane (e.g. up and down) as depicted in FIG. 2A. In other aspects, the track width may be disposed in an axial direction parallel to the drive axis (e.g. in a rotary drive configuration the track face forms an annulus or cylinder surrounding the drive axis T as in a "drum" shape, for example tracks 202S1', 202S2', 202S3', FIGS. 2E-F) with the encoding features projecting radially (for a rotary drive) or laterally from the track plane. In this aspect the at least one magnetic sensing member 203H may have a substantially flat (or otherwise without depending features) track interface that interfaces substantially directly with the track 202 but in other aspects, as described below, the at least one magnetic sensor may be connected to ferromagnetic members that include ferromagnetic features that interface with corresponding features on the track. In one aspect the magnetic source and the at least one sensing member 203H may be mounted to or otherwise integrally formed on a printed circuit board (PCB) 310 where the printed circuit board is a common circuit board (e.g. common to each magnetic source and each of the at least one sensing member). In other aspects each magnetic source and sensing member may be mounted to one or more respective printed circuit boards. In one aspect the magnetic source 300 may be a permanent magnet located within the external environment. In other aspects the magnetic source 300 may be any suitable source such as coils configured to be energized to produce a magnetic field. In one aspect the magnetic field generated by the magnetic source (the field lines illustrated in FIG. 3 for example purposes) depart from a north pole N (e.g. pole facing away from the track, in other aspects the magnetic poles may have any suitable orientations) of the source 300 (or in the case of energized coils in a direction determined by the flow of current through the coils), may propagate as shown, crossing the PCB 310, and flowing across the gap (e.g. between the sensing member 203H and the track 202) through the non-ferrous isolation wall 204, to the ferromagnetic track 202 and back to the opposing pole S of the magnetic source 300. As the ferromagnetic track moves relative to the magnetic source 300 one or more magnetic field profiles are generated. The magnetic field profiles may have a general shape of one or more of a sine wave or a cosine wave. The sensing member 203H is configured to detect changes to the magnetic flux that correlate with the ferromagnetic track motion (e.g. the magnetic field profiles).

Figure 4A:
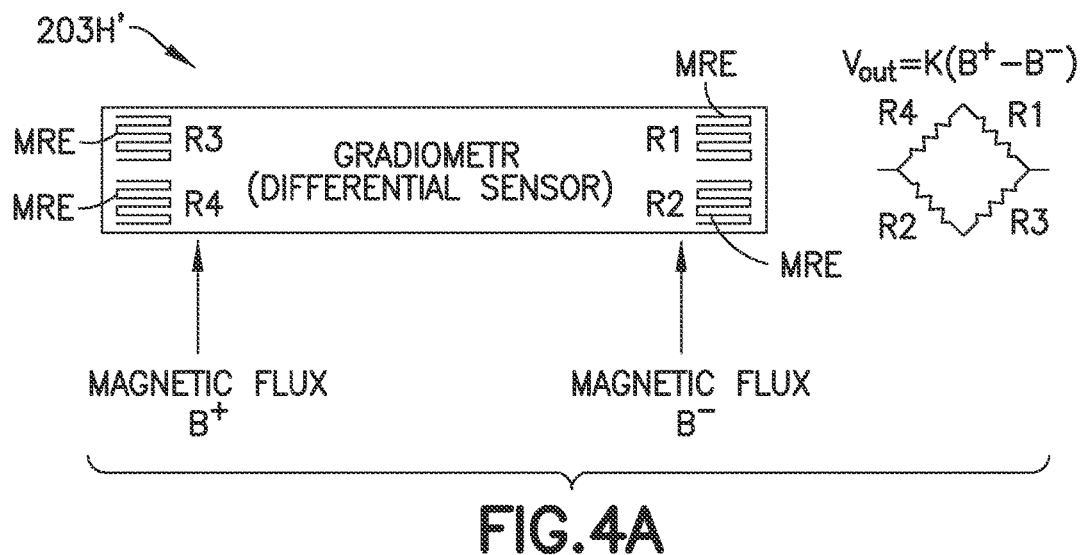
FIGS. 4A and 4B are schematic illustrations of portions of a sensor in accordance with aspects of the disclosed embodiment.
Figure 4B:
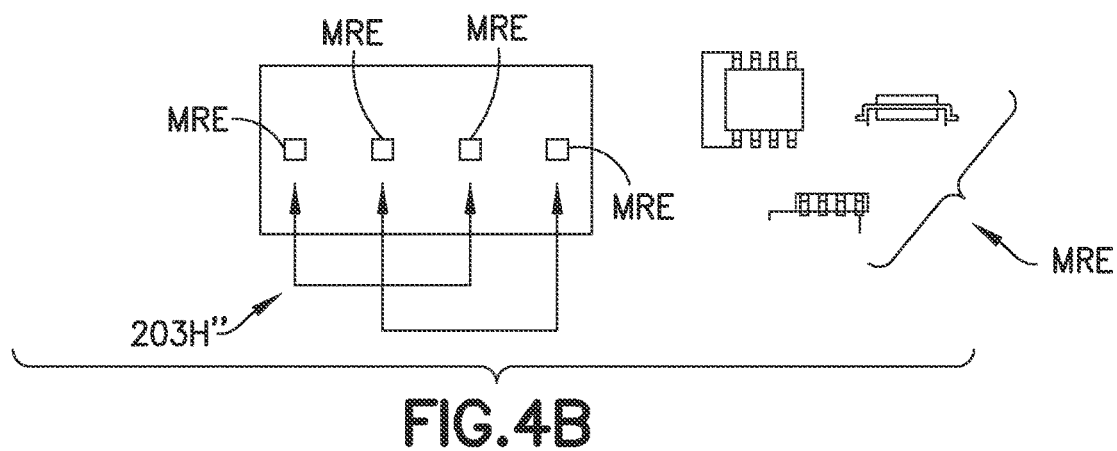

In one aspect the sensing member(s) 203H may be any suitable giant magneto resistive (GMR) sensing element/member capable of sensing a magnetic field in one or more locations. In other aspects the sensing member(s) may be any suitable sensing elements capable of sensing a magnetic field. In one aspect the sensing member 203H may be configured to produce a sinusoidal signal that can be used to provide a phase angle associated with, for example, an incremental (and/or absolute) position of the ferromagnetic track 202. In another aspect, referring to FIGS. 4A and 4B the sensing member(s) may be a differential Giant-Magneto-Resistive (GMR) sensing member (e.g. gradiometer) that is configured to sense a gradient field between two locations in space. The magnetic sensing system may be a gradiometer as previously noted. In the gradiometer configuration, an analog output signal of each sensing member may be proportional to the magnetic field gradient between two points in space. FIG. 4A illustrates a representative gradiometer sensing member 203H' including magneto resistive elements MRE that may be arranged to form, for example, a Wheatstone bridge that may effect a differential encoder channel. As may be realized, the arrangement of the MRE's (e.g. R1-R4) on the gradiometer sensing member may be characteristic of the encoding features on the encoder track and magnetic source. FIG. 4B illustrates an exemplary gradiometer sensing member 203H" in accordance with another aspect of the disclosed embodiment including magneto resistive elements MRE arranged to provide two differential signals (e.g. sine/cosine). The track pitch P (FIG. 3) and a position of the magneto resistive elements MRE on the sensing member 203H, 203H', 203H" may be matched such that differential sine and cosine outputs are obtained from each of the sensing members 203H, 203H', 203H".

Figure 5:
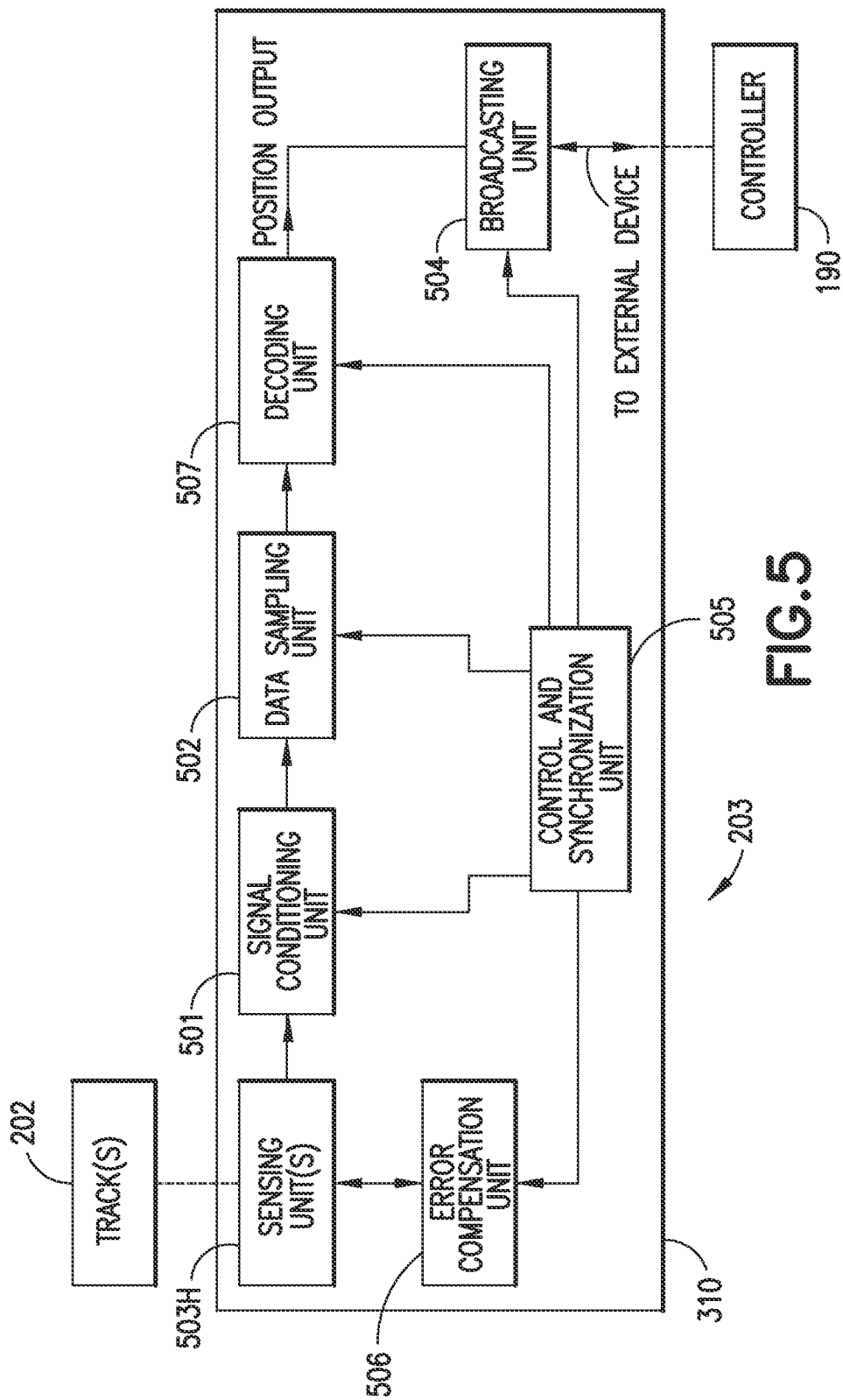

Referring to FIG. 5, there is shown a schematic diagram of the drive position determining circuitry in accordance with an aspect of the disclosed embodiment. The position determining circuitry may be integrated to a single printed circuit board, or otherwise packaged as desired. In one aspect the printed circuit board 310 (see FIG. 5) may include the one or more sensing members 503H (substantially similar to one or more of sensing members 203H, 203H', 203H" described above which may be integrated on a single chip), an error compensation unit 506, a signal conditioning unit 501, a data sampling unit 502, a decoding unit 507, a broadcasting unit 504 and a control and synchronization unit 505 (referred to herein as the "control unit"). The functional units are shown and described separately for simplicity but may be arranged and combined in the circuitry as desired. In other aspects the printed circuit board 310 may have any suitable configuration for carrying out position sensing as described herein.

The control and synchronization unit 505 may include any suitable modules for performing the sensor functions described herein. For example, referring also to FIG. 5C, the control and synchronization unit 505 may include one or more analog to digital converter modules 505A (oversampling), 505E (quiet time), 505F (tracks), an absolute position decoding module 505B, a sensor hysteresis compensation module 505C, a temperature compensation module 505D, an automatic track alignment calibration module 505G, an output protocol module 505H and an automatic amplitude, offset and phase calibration module 505I. As may be realized, while the modules 505A-505I are described as being integrated with the control and synchronization unit 505 in other aspects the modules 505A-505I may be mounted to or integrated in the circuit board 310 so as to be accessible by the control and synchronization unit 505. For example, the modules 505A-505I may be integrated into one or more of the functional units 501, 502, 504, 503, 507 or any other suitable component of the circuit board 310 sensing circuit. In still other aspects the modules 505A-505I may be mounted "off board" the circuit board 310 such as in any suitable controller but accessible by the control and synchronization unit 505. The oversampling analog to digital converter module 505A may be configured to oversample (at any desired configurable sampling rate) sensor readings as described herein to improve noise immunity. The analog to digital converter module 505E may be configured to sample sensor signals at "quiet times" as described herein to avoid noisy events within the sensor circuit. The analog to digital converter module 505F may be configured to provide an on board analog to digital conversion of track data (e.g. position feedback data) and allow for improved signal integrity while avoiding a need for long interconnect cables between the position feedback and an external controller. The absolute position decoding module 505B may be configured to allow the absolute position of the sensor to be identified upon power up or at any other desired time such that an incremental position can be properly aligned to the true absolute position. The sensor hysteresis compensation module 505C may be configured to minimize hysteresis inherent to the sensors 503H at any suitable positions corresponding to one or more of a motor position or a robot arm position. The temperature compensation module 505D may be configured to allow compensation of temperature effects and may include any suitable temperature look up table. The automatic track alignment calibration module 505G may be configured to identify a common origin between different tracks 202 using, for example, a software calibration so relax tolerances of sensor locations in the circuit board 310 relative to the respective tracks 202. The output protocol module 505H may be configured to provide a substantially universal integration with different types of controllers using different communication protocols.

As may be realized, the one or more sensing members 503H may generate raw analog signals (sine and/or cosine signals) that reflect the topology of a respective scale 202S on the ferromagnetic track 202 (FIG. 2C). The error compensation unit 506 may be configured to suitably address any limitations corresponding to the sensing technology selected (which in this case may be GMR sensing technology or any other suitable sensing technology). Examples of such limitations may include signal distortion due to sensor non-linearity and saturation as well as temperature drift effects and external magnetic field disturbances. The error compensation may be performed on demand such as with commands from the control and synchronization unit 505 to the error compensation unit 506 or at any other suitable predetermined time(s). The signal conditioning unit 501 may be configured to scale (or otherwise calibrate—an example of which is the normalization of the sinusoidal amplitudes and offset removal) the raw analog signals from the sensing members 503H to a value within a deterministic range. The data sampling unit 502 may be any suitable converter, such as an analog to digital converter, configured to convert the conditioned signals into raw digital data to be processed by any suitable controller, such as those described herein. The decoding unit 503 may be configured to process the raw digital data generated by the data sampling unit 502 and convert that raw digital data to position output data. It is noted that if an absolute position is desired, the absolute position may be obtained from analyzing data from multiple scales 202S on the ferromagnetic track 202 as will be described below. The broadcasting unit 504 may be configured to transmit the position output data to an external device such as any suitable motion controller 190 (which may be communicably connected to the at least one sensor where the a control and synchronization unit 505 receives sensor signals from the at least one sensor and is suitably configured to control a change in at least a predetermined characteristic of the sensor signals, such as those noted below, in response to communications from the motion controller). The broadcasting unit 504 may also be configured to provide input information from the motion controller 190 that may be used by the control and synchronization unit 505 to effect timing and scheduling as will be described below.

The control and synchronization unit 505 may be configured to manage and schedule the individual functional units 503H, 501, 502, 504, 506, 507 as shown in FIG. 5. As noted above, the individual functional units 503H, 501, 502, 504, 506, 507 and control and synchronization unit 505 may be integrated into a single position feedback module that can be installed in and removed from, for example, any suitable motor as unit or unitary module. In one aspect the position feedback module may be calibrated (FIG. 5B, Block 589) in any suitable manner. For example, the calibration may be performed "off board" a motor (e.g. while not installed in a motor) on, for example, at test bench as the relationship between the sensing units is known. For example, any suitable software calibration may be performed such that the position feedback module is calibrated off board in its entirety (e.g. such that the module is ready for operation) and installed. A final alignment calibration between the sensing unit(s) 503H and the respective tracks 202 may be performed (such as automatically with the on-board automatic track calibration module 505G) with the position feedback module in place (e.g. on board the motor). In other aspects the motion controller 190 may be configured to manage and schedule the individual functional units 503H, 501, 502, 504, 506, 507 in a manner substantially similar to that described below with respect to the control and synchronization unit 505. In still other aspects the management and scheduling of the individual functional units may be shared between the control and synchronization unit 505 and the motion controller 190. For example, the error compensation unit 506 can be enabled by the control and synchronization unit 505 at any suitable time (e.g. such as on-demand) to improve accuracy and reproducibility of the sensing member 503H signal output. The signal conditioning unit 501 may also be controlled by the control and synchronization unit 505 to substantially automatically normalize the analog signals upon request from the control and synchronization unit 505 or at any other suitable time. The data sampling unit 502 execution can also be controlled by the control and synchronization unit 505 so that position data is sampled at "quiet" times where the sensing circuit is not subject to transients or at any other suitable time(s). The control and synchronization unit 505 may also be configured to define oversampling parameters to improve data quality from the data sampling unit 502. The oversampling data may be taken at any suitable time such as during "quiet times" as described herein. The control and synchronization unit 505 may also effect position calculations by sending command(s) to the decoding unit 507 when proper sampled data is available. The control and synchronization unit 505 may also be configured to control the broadcasting unit 504 such that a final decoded position is output at predetermined times.

Figures 1, 5A:
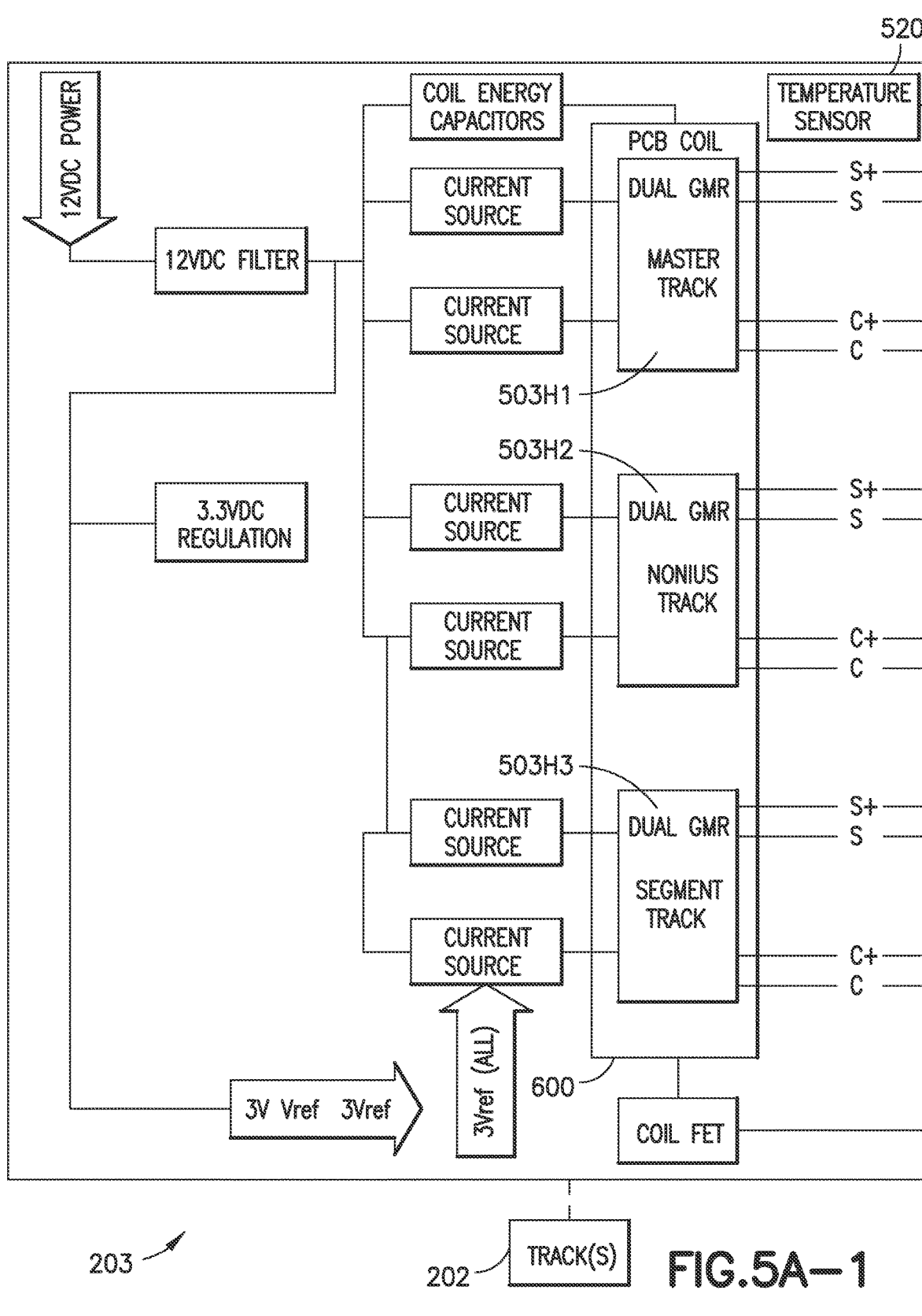

An exemplary implementation of the block diagram of FIG. 5 is illustrated in FIG. 5A. In this aspect the printed circuit board 310 includes three sensing members 503H1, 503H2, 503H3 (each capable of providing two differential signals) for obtaining position signals from a ferromagnetic track 202 (see for example, FIGS. 2C and 6A) having three scales 202S. In one aspect the sensing members 503H1, 503H2, 503H3 (as well as the other sensors described herein) may be immovably fixed to the circuit board. In other aspects the sensing members (as well as the other sensors described herein) may be movably mounted to the circuit board so that the sensing members may be adjusted relative to their respective track 202 scales 202S. Referring to FIGS. 2C and 6A-6C, in one aspect the scales 202S may represent a 3-scale Nonius pattern that includes a master scale 202S1, a Nonius scale 202S2 and a segment scale 202S3 but in other aspects the ferromagnetic track may include any suitable number of scales having any suitable positional relationship relative to one another. Here each scale 2102S may include A respective equally spaced pattern (e.g. each scale pattern may have a respective pitch P1, P2, P3) of ferromagnetic features 202SE (e.g. slots, protrusions, etc.). For each scale 202S there may be a dedicated sensing member 503H1-503H3 that is configured to provide analog signal outputs that substantially mimic, for example, sine and cosine waves. In one aspect one or more of the sensing members 503H1-503H3 may be arranged at any suitable angle $\alpha 1$, $\alpha 2$ relative to another of the sensing members 503H1-503H3 and/or a respective track 202S1-202S3. In other aspects the sensing members 503H1-503H3 may have any suitable position relationship relative to each other and/or the respective tracks 202S1-202S3. As may be realized, each scale period and number of ferromagnetic features 202SE allows for a track design that can be used to decode the absolute position of the track by using any suitable Nonius interpolation approach (see FIG. 5 which illustrates one suitable absolute position decoding algorithm for a 3-scale track 202 as described herein).

One or more coils 600 may be integrally formed as a one piece unit with (or otherwise mounted to or formed on) the printed circuit board 310 in any suitable manner for hysteresis compensation as will be described below. It is noted that the data sampling unit 502 and decoding unit 507 may be formed as an integral device or module as shown in FIG. 5A while in other aspects the data sampling unit 502 and decoding unit 507 may be separate units. As can also be seen in FIG. 5A any suitable memory 505M may be connected to the control and synchronization unit 505.

Figure 5B:
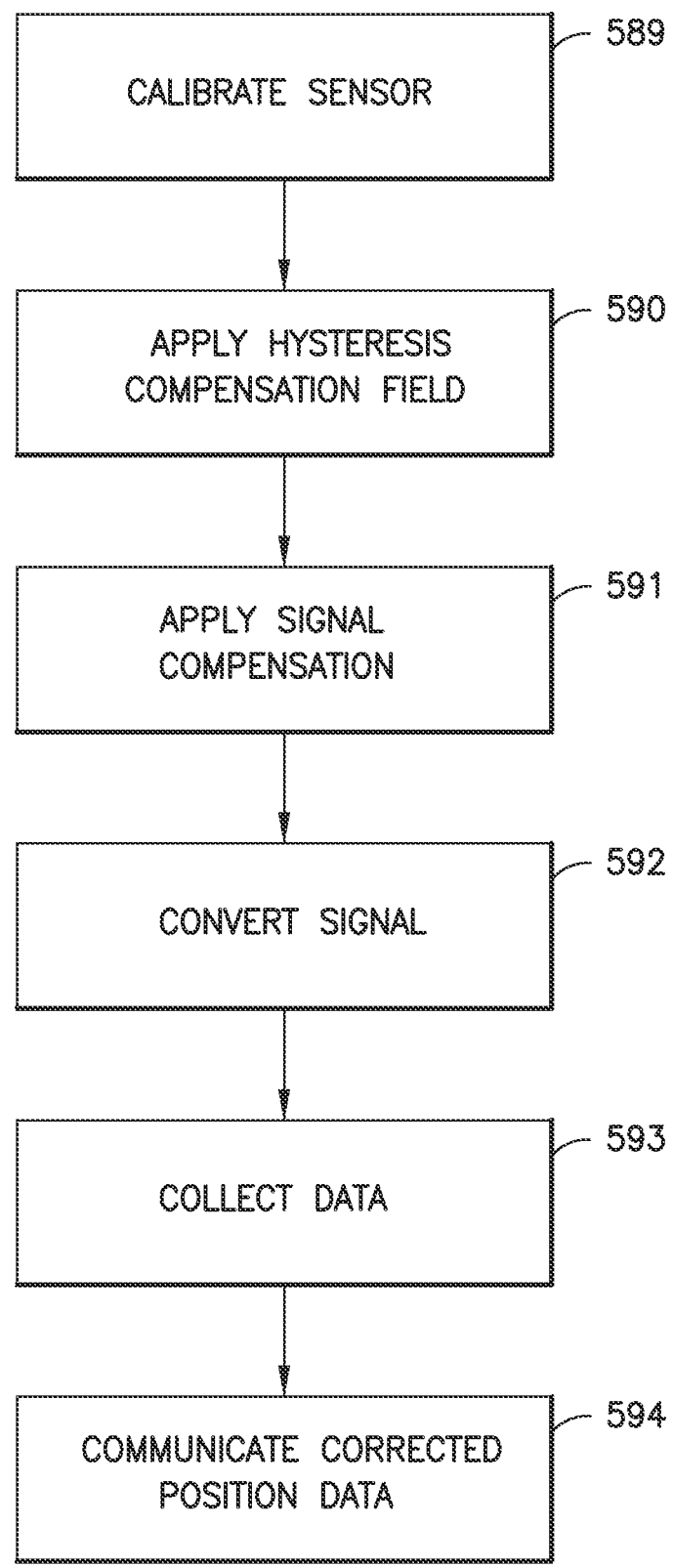
FIG. 5B is a flow chart in accordance with aspects of the disclosed embodiment.
Figure 5C:
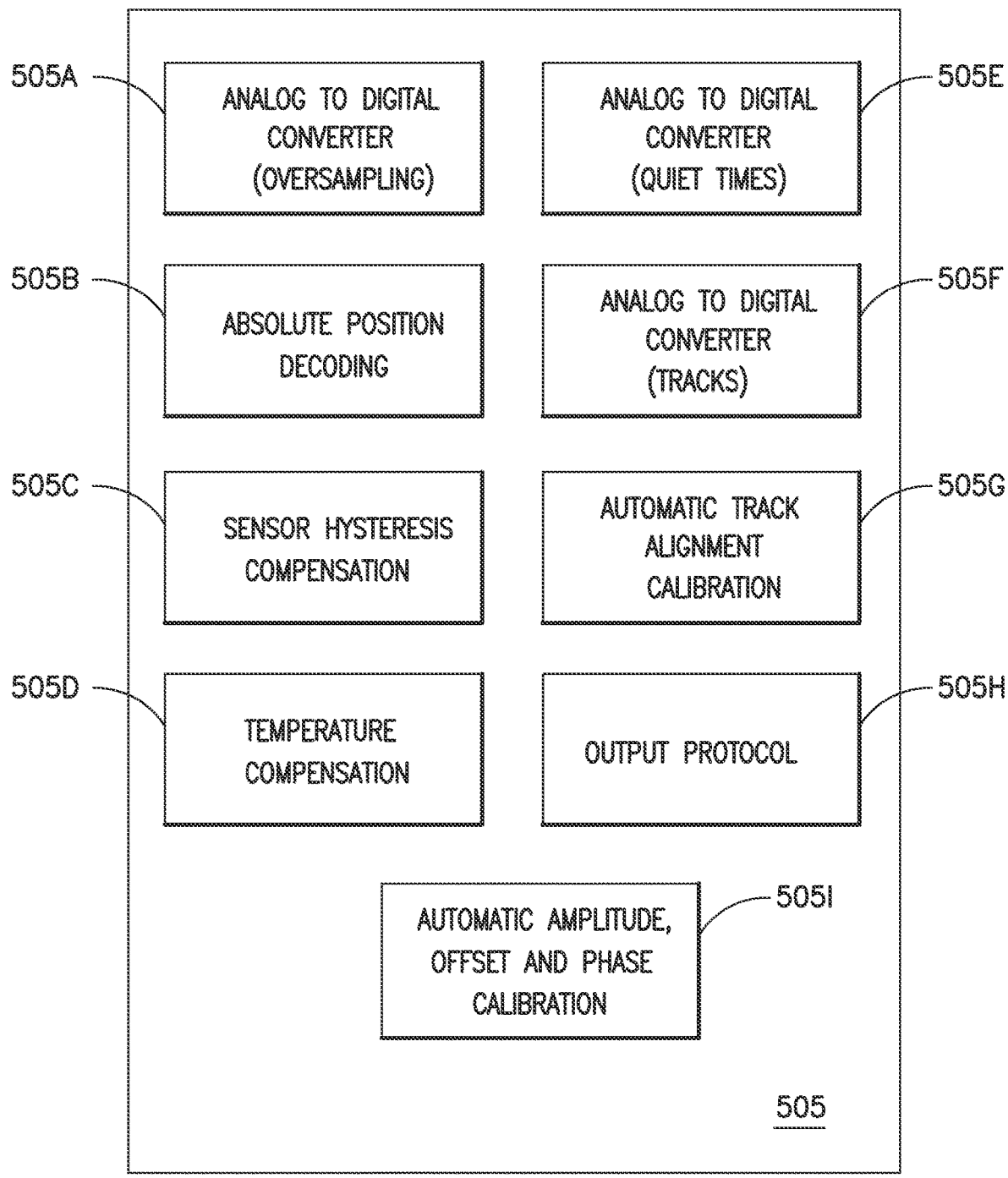
FIG. 5C is a schematic illustration of a portion of a sensor in accordance with aspects of the disclosed embodiment.
Figure 6A:
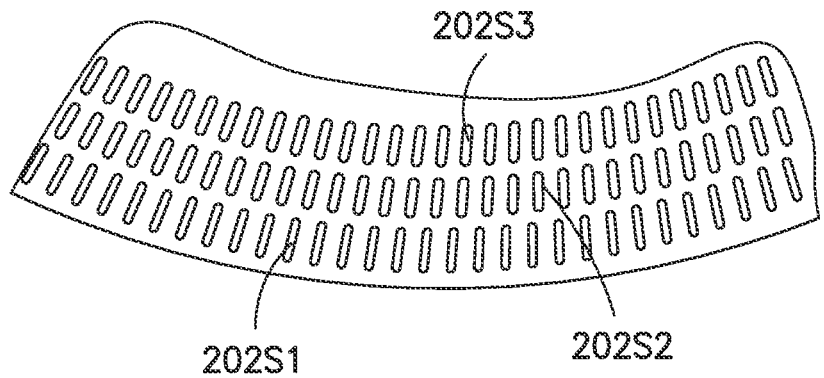
FIGS. 6A and 6C are schematic illustrations of a portion of a sensor in accordance with aspects of the disclosed embodiment and FIG. 6B illustrates a position decoding algorithm in accordance with aspects of the disclosed embodiment.
Figure 6C:
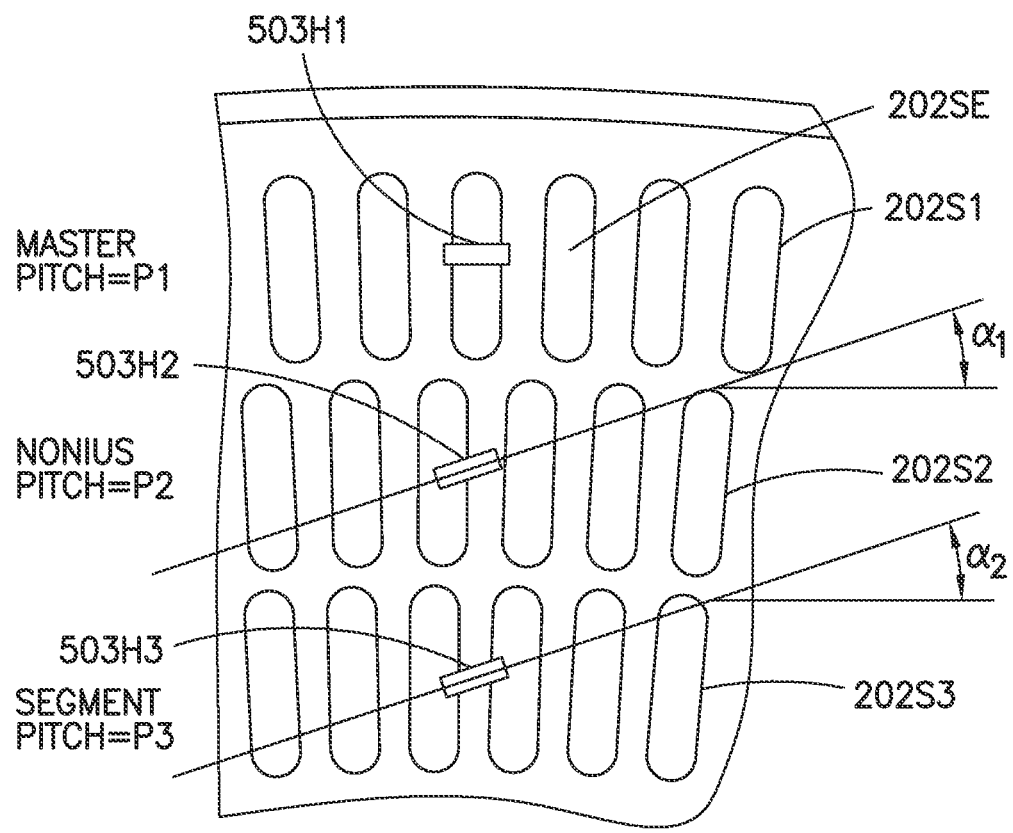
Figure 6B:
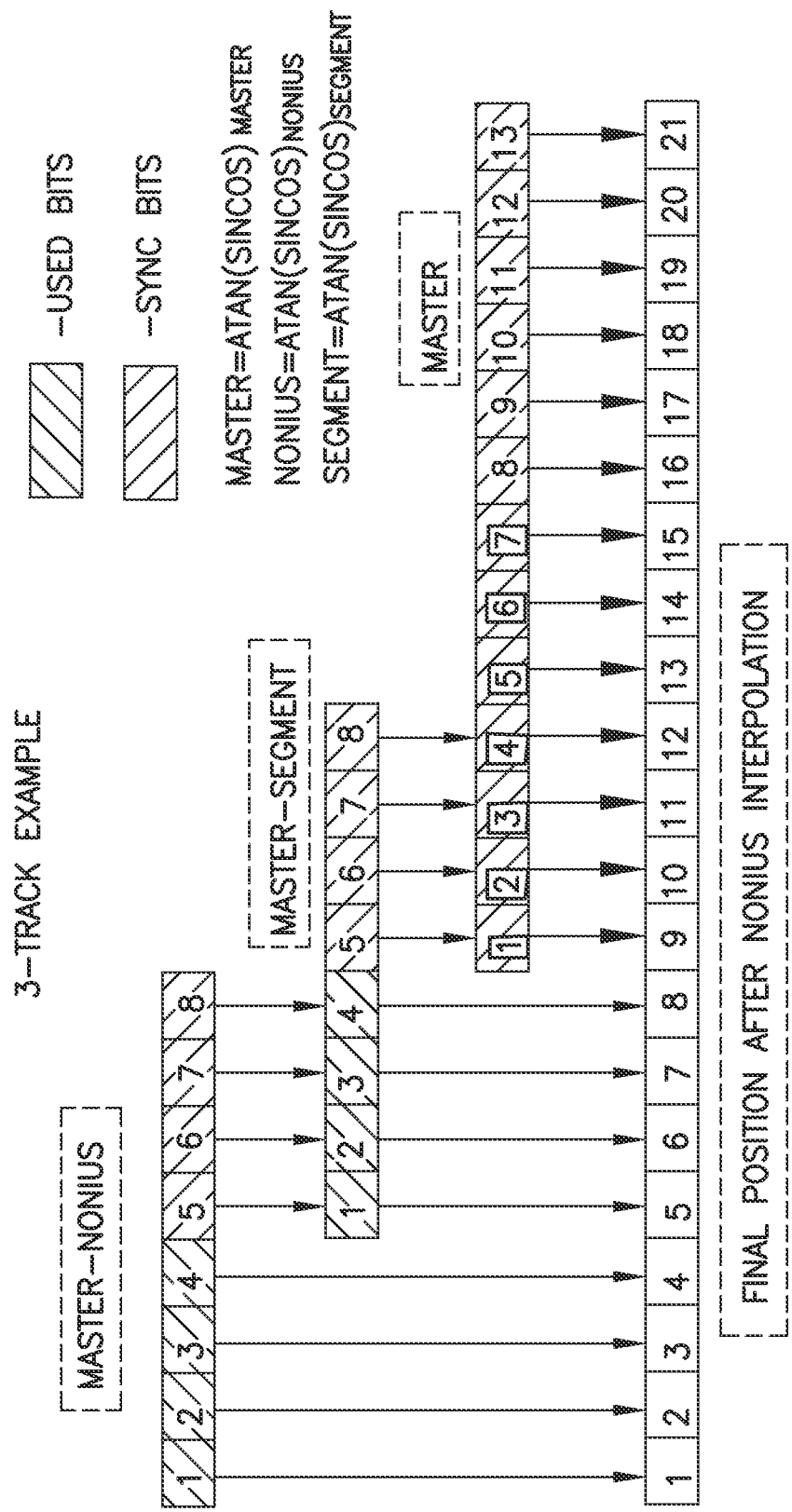
Figure 7A:
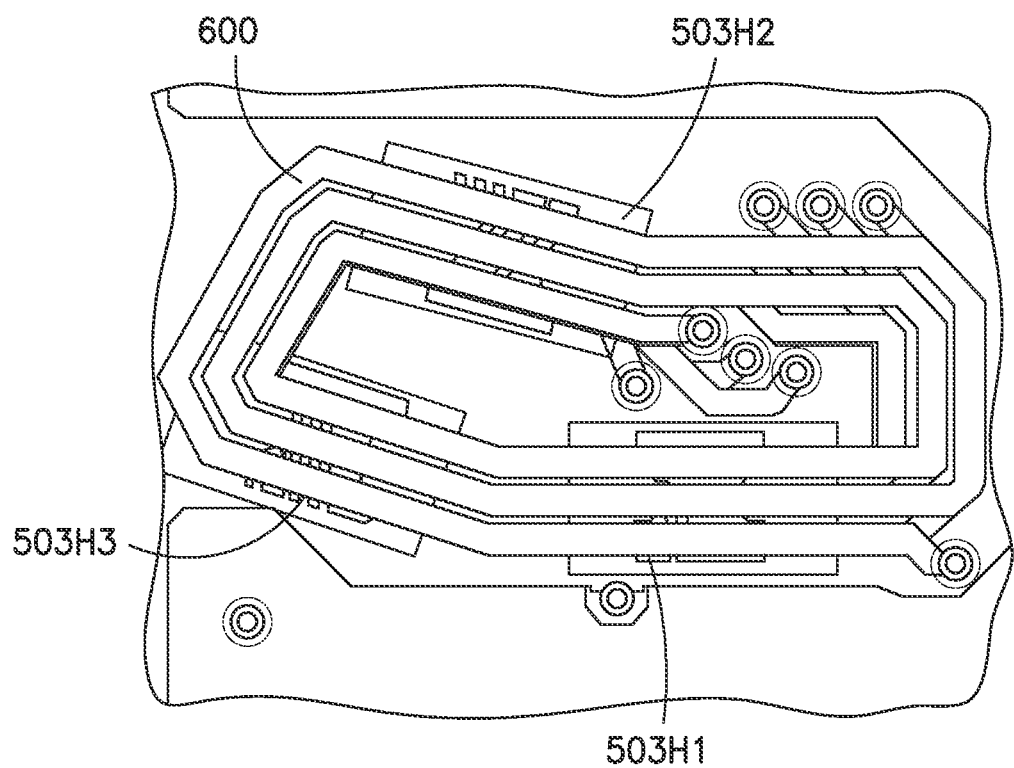
FIGS. 7A-7D are schematic illustrations of a portion of a sensor in accordance with aspects of the disclosed embodiment.
Figure 7B:
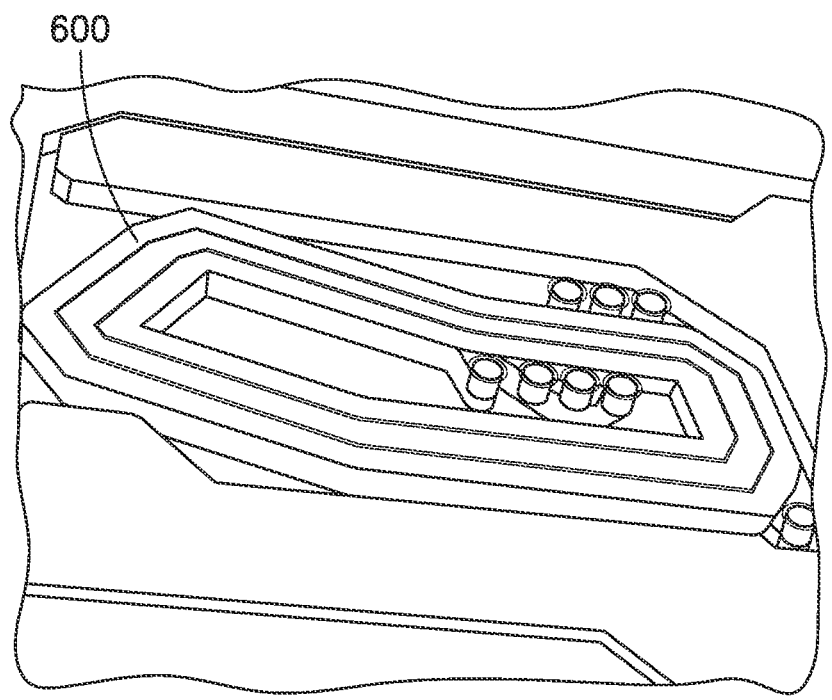
Figure 7C:
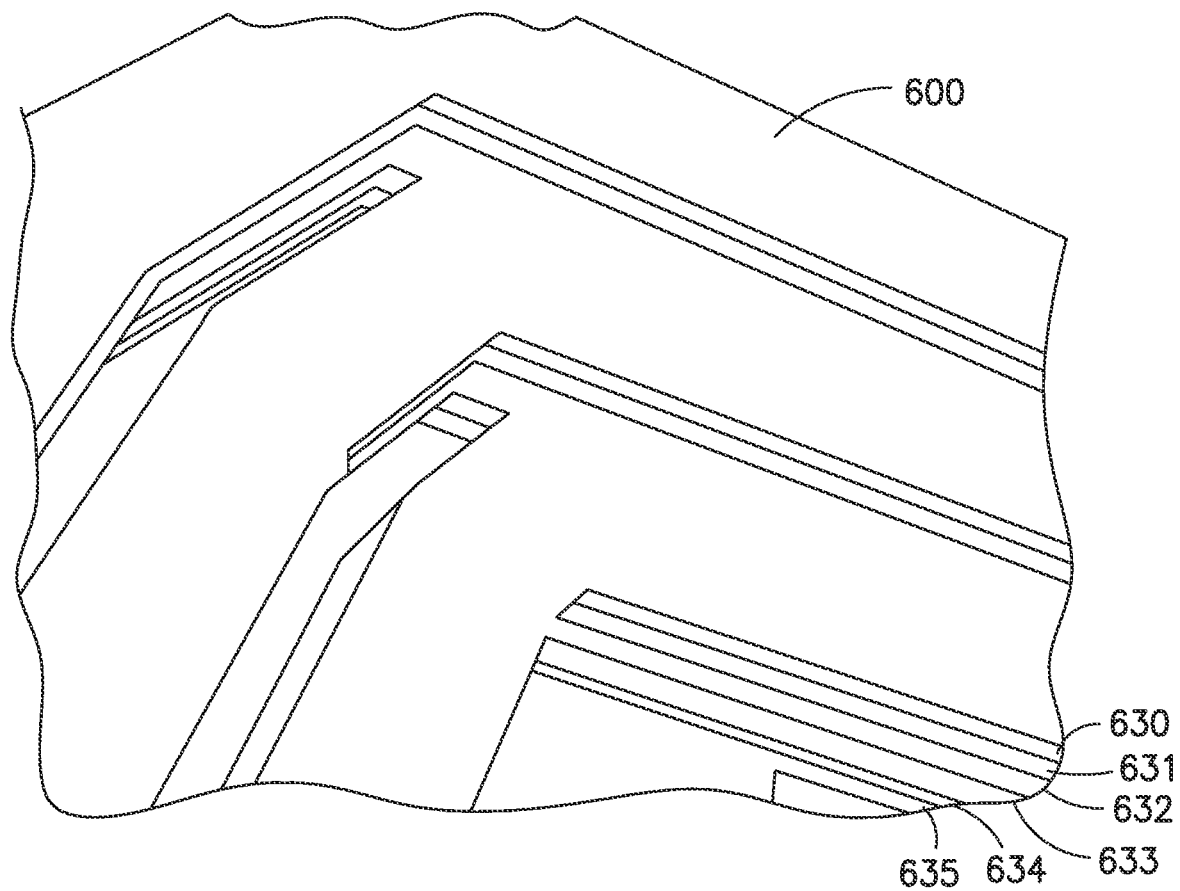
Figure 7D:
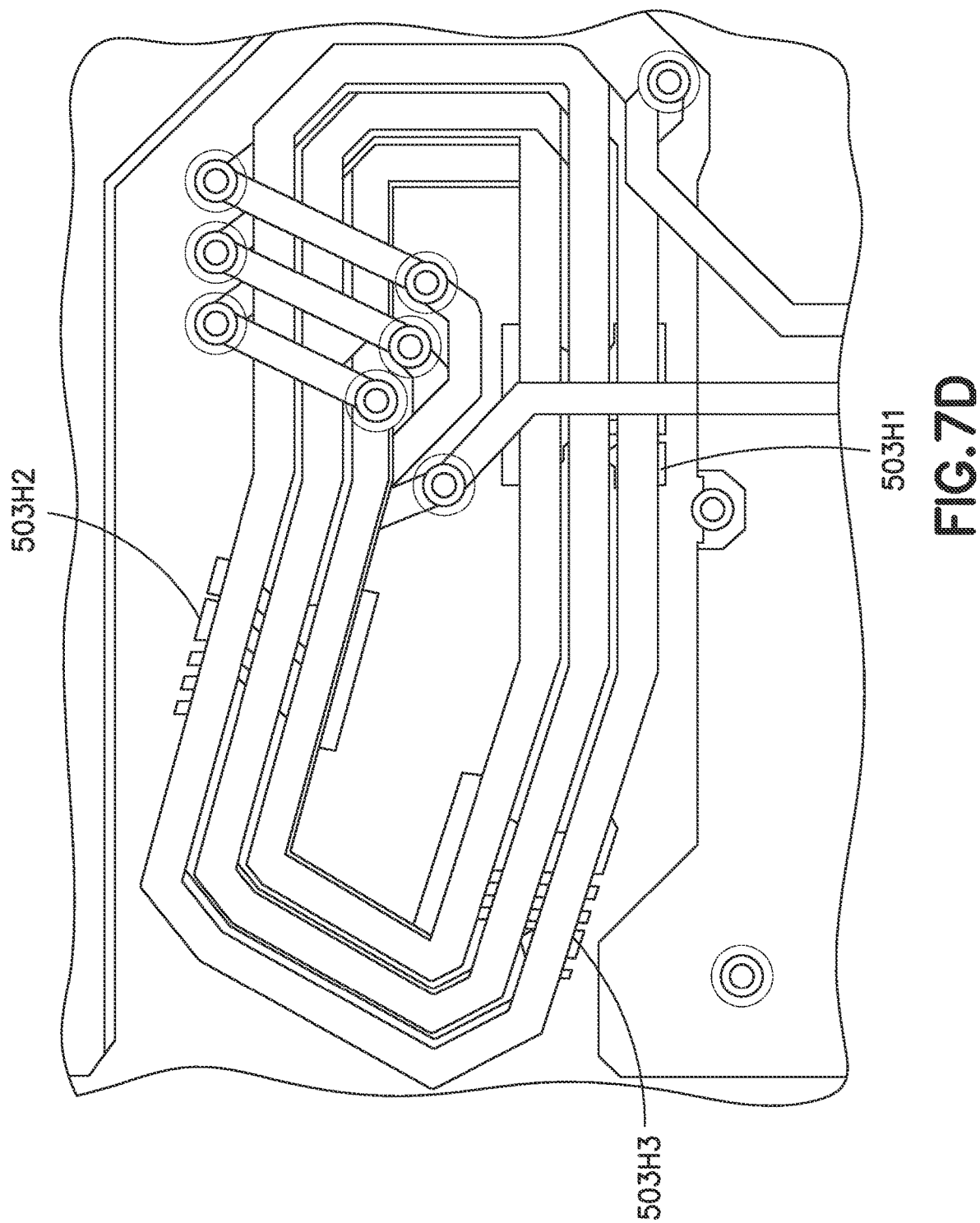

In one aspect the control and synchronization unit 505 may be configured to generate sensor signal commands to at least one sensor based on sensor signals received from the at least one sensor, where the sensor signal commands effect a change in at least a predetermined characteristic of the sensor signals. For example, the control and synchronization unit 505 may be configured to control hysteresis in any suitable manner, such as through a hysteresis compensation mechanism or module 505C (e.g. the one or more coils 600 and associated hardware and software for energizing the coil(s)) as will be described below. In one aspect the control and synchronization unit 505 may effect energizing the coils so that the respective sensing members 503H1, 503H2, 503H3 are driven into saturation. The control and synchronization unit 505 may schedule position data sampling times, such as with module 505E, so that position data is not sampled during the times that the hysteresis is being compensated (e.g. position data is not sampled when the coil(s) is energized). By compensating for hysteresis in the sensing members 503H, consistent analog signals may be output by the sensing members 503H. In one aspect the one or more coils 600 may be provided on the printed circuit board 310 adjacent a respective sensing member 503H1, 503H2, 503H3 as shown in FIGS. 7A-7D which illustrate the coil(s) 600 being formed in one or more layers 630-635 on or in the printed circuit board 310. As an example of hysteresis compensation in accordance with aspects of the disclosed embodiment, the control and synchronization unit 505 may cause the application of a hysteresis compensation field in the one or more of the sensing members 503H by energizing the coil(s) 600 at any suitable time (FIG. 5B, Block 590). For example, in one aspect, the control and synchronization unit 505 may monitor the signals received from the sensors and when a predetermined characteristic of the signal (e.g. noise, amplitude, signal distortion, etc.) is outside a predetermined range and/or exceeds a threshold value the hysteresis compensation field may be generated. The control and synchronization unit 505 may wait a predetermined time after the hysteresis compensation field collapses and then command the signal conditioning unit 501 to apply an appropriate (e.g. any suitable) signal compensation to the resulting hysteresis-compensated signal from one or more of the one or more sensing members 503H (FIG. 5B, Block 591). It is noted that position signals from the one or more sensing members 503H may not be valid during times where the coil(s) 600 are energized and the hysteresis compensation field is not collapsed. The control and synchronization unit 505 may trigger or otherwise command the data sampling unit 502 to convert the conditioned analog signal into digital data (FIG. 5B, Block 592) and command the decoding unit 507 to collect the digital data from the data sampling unit 502 and translate this digital data into final corrected position data (FIG. 5B, Block 593). The control and synchronization unit 505 may command the broadcasting unit 504 to communicate the final corrected position data to any suitable controller such as controller 190 (FIG. 5B, Block 594) such that the controller 190 uses the final corrected position data to control movement of the robot drive 200 and the one or more arms attached thereto.

The aspects of the disclosed embodiment may allow for a level of customization that can be used to optimize the performance of any suitable position feedback system such as those described herein with respect to semiconductor automation robots. In one aspect the control and synchronization unit 505 and/or the data sampling unit 502 may be configured such that the analog to digital conversion is configurable with oversampling (such as with module 505A) to allow for improved noise immunity. As noted above, the data sampling and analog to digital conversion of the sensor signals for determining the position of, e.g., the drive 200 (and hence the robot arms) may be performed at "quiet times" (such as with modules 505A and/or 505E) which, as noted above, are times that avoid noisy events within the circuit (e.g. noisy events such as hysteresis compensation, transients, etc.). In another aspects the control and synchronization unit 505 may include any suitable programming and/or algorithms stored in, for example, memory 505M that allows for on-demand absolute position decoding (such as with module 505B) where the absolute position can be identified upon power up or any other suitable time such that an incremental position can be properly aligned to the absolute position (this can be effected through the different scales on the ferromagnetic track as described herein). The control and synchronization unit 505 may include any suitable programming and/or algorithms stored in, for example, memory 505M that allows for on-board (e.g. determined locally by the processing capabilities of the sensor 203) substantially automatic track alignment calibration (such as with module 505G) where a common origin between the different scales 202S of the ferromagnetic track 202 is identified (e.g. such as by comparing signals of each scale) so that tolerances of the sensor member 503H locations can be relaxed in the electrical circuit of the printed circuit board 310 relative to the ferromagnetic track 202. As noted above, the coil(s) 600 and the control and synchronization unit 505 may allow for on-demand hysteresis compensation (as noted above—such as with module 505C) that may be inherent to some sensing members at any suitable positions of the ferromagnetic track (and hence the robot drive/robot arm) where repeatability of position is desired. The control and synchronization unit 505 may include any suitable programming and/or algorithms stored in, for example, memory 505M that allows for on-board substantially automatic amplitude, offset and phase calibration (such as with module 505I) which may allow for substantially real-time (where real time refers to an operational deadline from an event to a system response) signal conditioning to compensate for drifts due to, for example, mechanical run out (or other state condition of the sensor such as a rotation direction of the track 202 and/or sensor hysteresis) and/or ambient condition effects (e.g. such as a temperature of the at least one sensor). In another aspect, the control and synchronization unit 505 may include any suitable programming and/or algorithms stored in, for example, memory 505M that allows for on-board temperature compensation (such as with module 505D). For example, the sensor 203 may include a temperature sensor 520 (FIG. 5A) communicably connected to the control and synchronization unit 505 for determining a temperature of one or more of the printed circuit board 310, the sensing members 203H, 203H', 203H", 503H1-503H3, the ferromagnetic track 202 (and/or scales thereon) or any other suitable component of the sensor 203. Any suitable lookup table may be resident in any suitable memory, such as memory 505M that correlates, for example, sensor signals with temperature to provide signal conditioning compensation against temperature effects. As can be seen in FIG. 5A, the sensor may be provided with on-board analog to digital conversion for each scale 202S of the ferromagnetic track 202 which may allow for increased analog signal integrity and avoid a need for long interconnect cables between the position feedback sensor 203 and an external controller such as controller 190. The control and synchronization unit 505 and/or the broadcast unit 504 may also be configured to provide multiple output protocols (such as with module 505H) to allow for substantially universal integration with different types of controllers. For example, the different communication protocols may be stored in any suitable memory of the sensor, such as memory 505M or a memory resident in the broadcast unit 504.

Figure 8A:
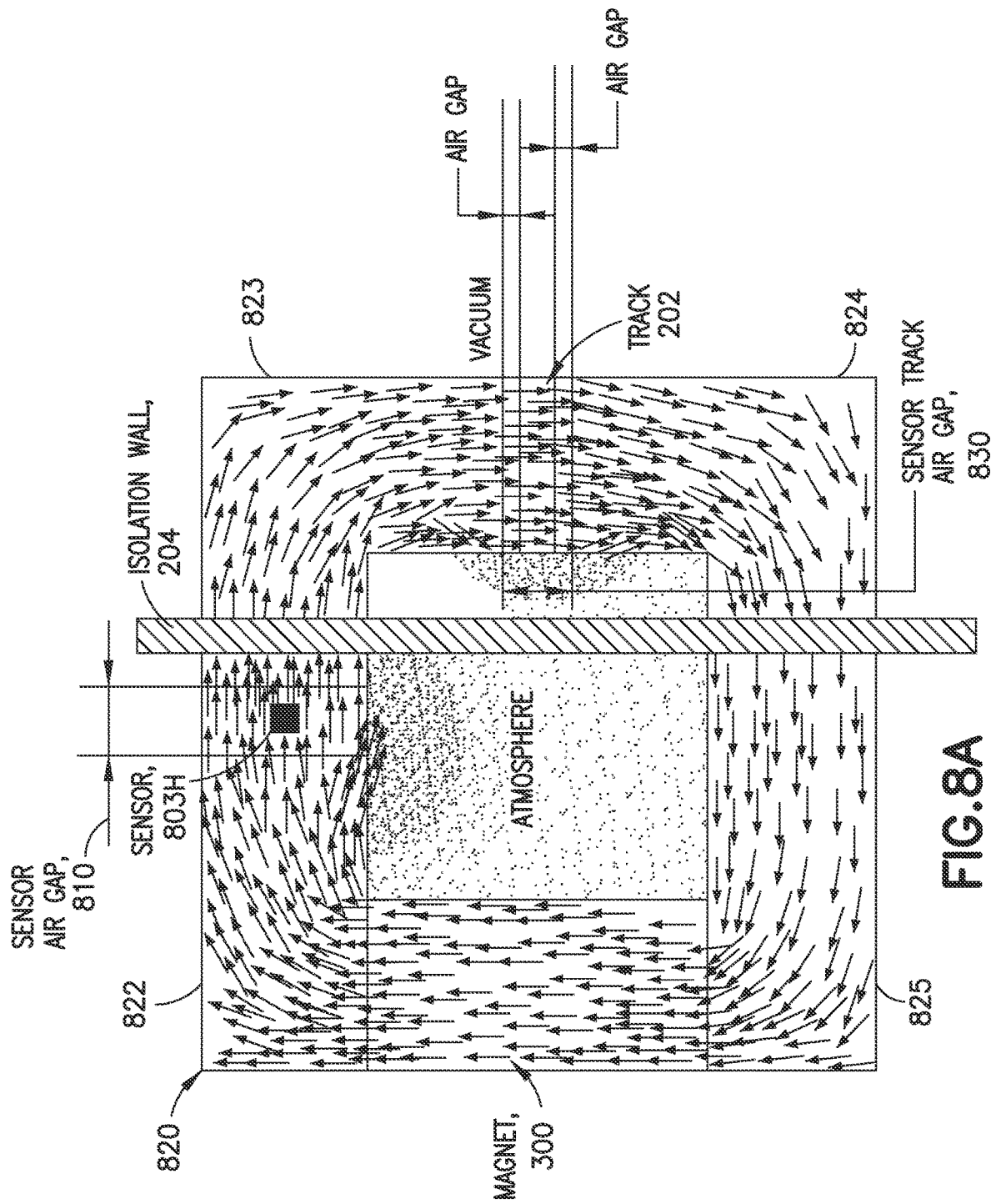
FIGS. 8A and 8B are schematic illustrations of a portion of a sensor in accordance with aspects of the disclosed embodiment.
Figure 8B:
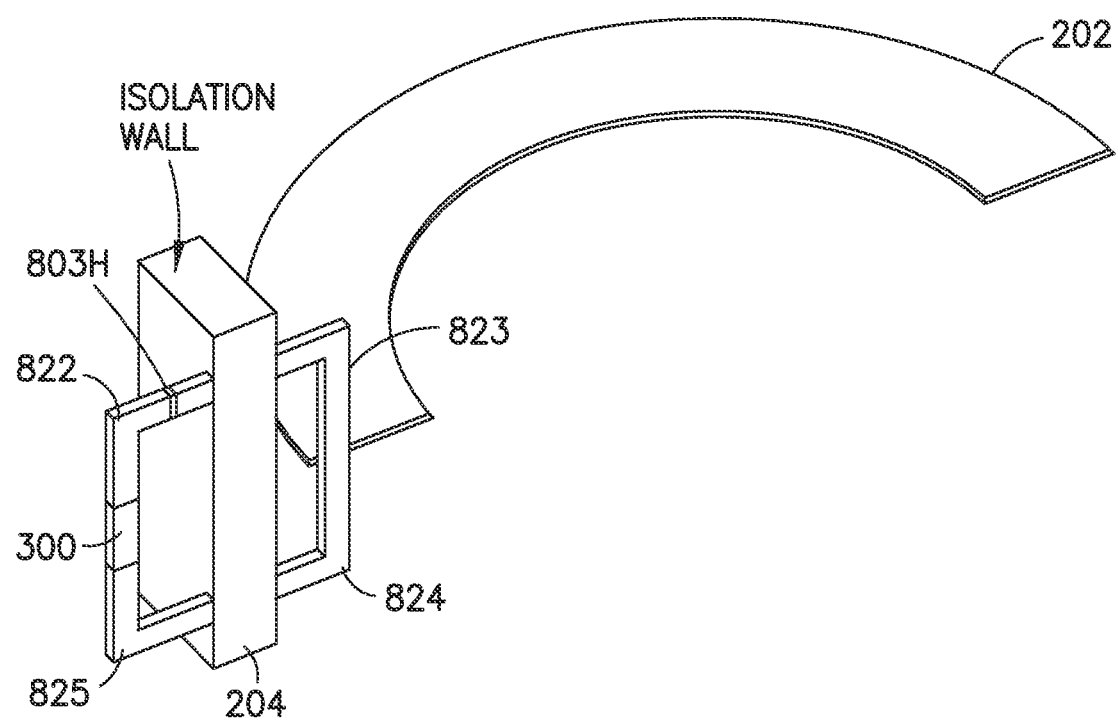

Referring now to FIGS. 8A and 8B, a portion of a sensor 203' is illustrated in accordance with an aspect of the disclosed embodiment. The sensor 203' may be substantially similar to those described above however, in this aspect the sensing member 803H (which may be substantially similar to the sensing members described above) may be disposed substantially within a sensor air gap 810 of a ferromagnetic circuit member or flux loop 820. The ferromagnetic circuit member 820 may include a magnetic source 300 (which may be a permanent magnet or one or more coils configured to generate a magnetic field as described above), a first leg 822 (which includes the sensor air gap 810) coupled to the magnetic source 300, a first extension member 823 communicably connected to the first leg 822 such that the isolation wall 204 is disposed between the first extension member and the first leg (in other aspects the first leg and first extension member may be a one piece member that extends through the isolation wall 204 in any suitable manner), a second extension member 824 communicably interfaced with the first extension member 823 across a sensor track air gap 830, and a second leg 825 communicably connected to the second extension 824 such that the isolation wall 204 is disposed between the second extension member and the second leg (in other aspects the first leg and first extension member may be a one piece member that extends through the isolation wall 204 in any suitable manner). The second leg 825 is also coupled to the magnetic source 300. As can be seen in FIG. 8A, the ferromagnetic circuit member 820 forms a magnetic circuit between the magnetic source 300 and the track 202 such that magnetic flux departs from, for example, a north pole of the magnetic source 300, travels along the first leg 822, across the sensor air gap 810 where the sensor is located, across the non-ferromagnetic isolation wall 204, continuing along the first extension member 823 across the track air gap 830 (e.g. through the track 202) and along the second extension member 823 to return through the isolation wall 204 such that the magnetic flux travels along the second leg 825 to, for example, the south pole of the magnetic source 300. The arrangement of the ferromagnetic circuit member 820 allows the sensing member 803H to detect changes in the sensor air gap 810 reluctance caused by changes in the profile of the track 202 (e.g. as the track 202 moves relative to the extension members 823, 824) without having to be placed in an air gap located between the track 202 and the magnetic source 300. The arrangement of the ferromagnetic circuit member 820 also allows for the sensor electronics to be located in the external environment as noted above. It is noted that the isolation wall may be disposed between the portions of the ferromagnetic circuit members in a manner substantially similar to that described in U.S. provisional patent having U.S. application No. 61/903,813 entitled "SEALED ROBOT DRIVE" and filed on Nov. 13, 2013, previously incorporated by reference herein in its entirety.

Figure 9B:
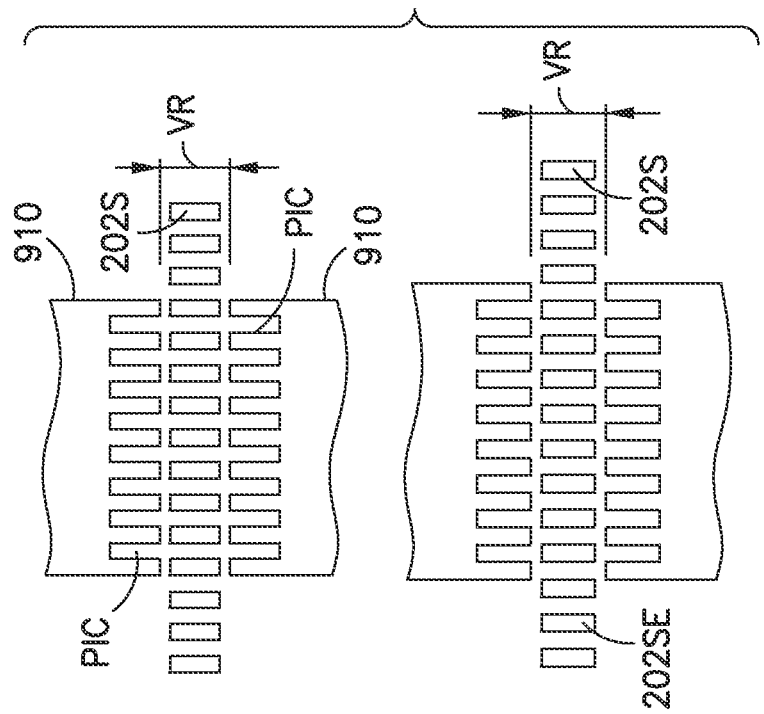
FIGS. 9A-9C are schematic illustrations of a portion of a sensor in accordance with aspects of the disclosed embodiment.
Figure 9A:
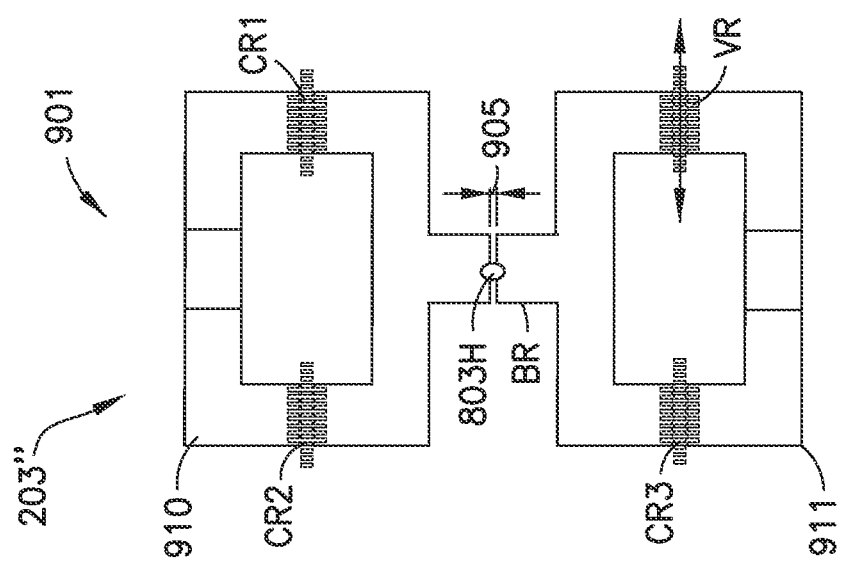
Figure 9C:
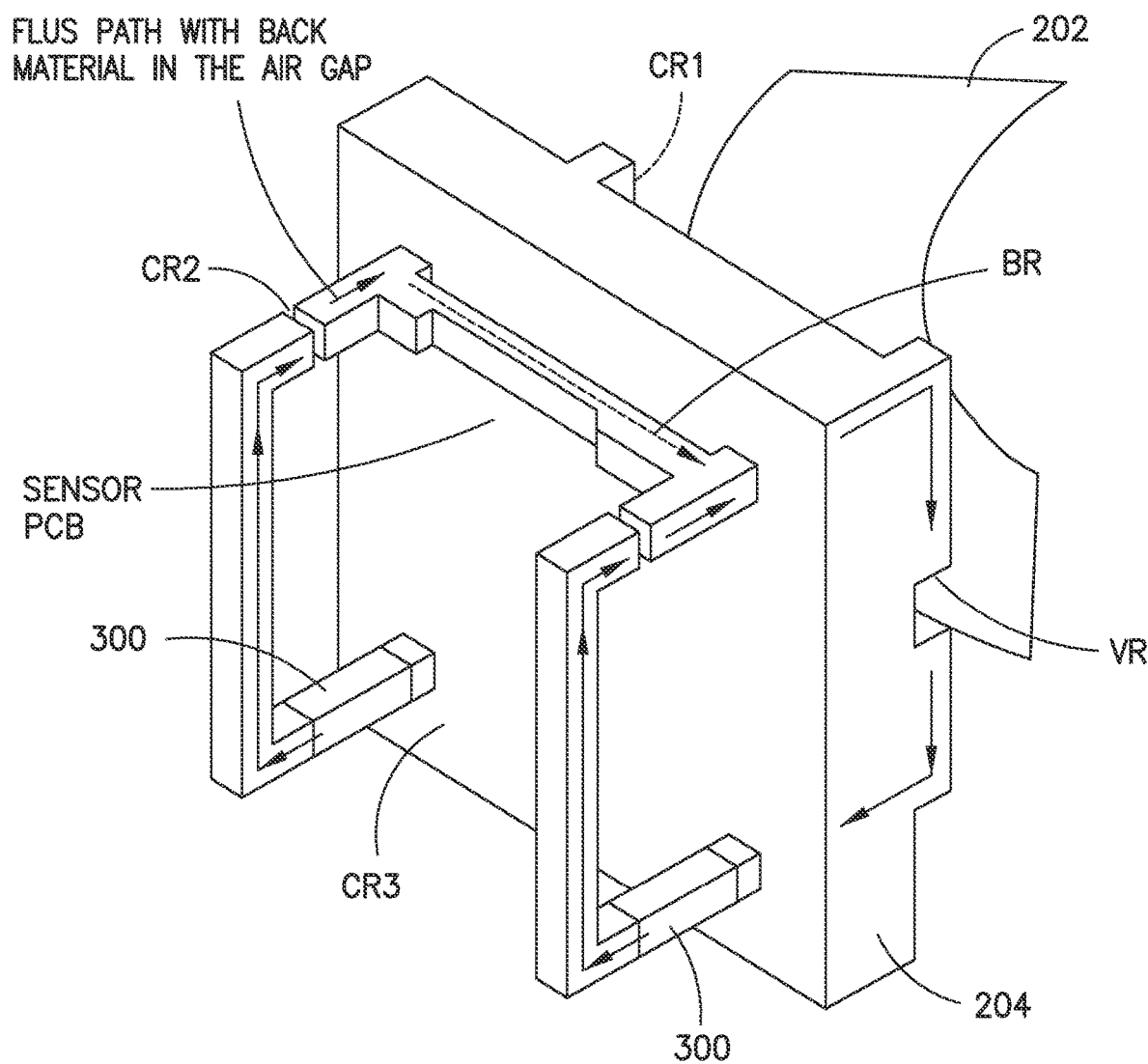

Referring now to FIGS. 9A-9C, a portion of a sensor 203" is illustrated in accordance with an aspect of the disclosed embodiment. The sensor 203" may be substantially similar to those described above however, in this aspect the sensing member 803H (which may be substantially similar to the sensing members described above) may be disposed substantially within a sensor air gap 905 of a ferromagnetic bridge circuit 901 that is configured to emulate a Wheatstone bridge. The ferromagnetic bridge circuit includes a first the ferromagnetic circuit member 910 and a second the ferromagnetic circuit member 911 both of which may be substantially similar to the ferromagnetic circuit member 820 described above such that each of the first and second the ferromagnetic circuit members 910, 911 have portions (e.g. separated by the isolation wall 204) that are located in the external environment and in the sealed environment. Each of the ferromagnetic circuit members 910, 911 have two air gaps (e.g. one disposed on either side of the isolation wall 204). For example, ferromagnetic circuit member 910 includes air gap CR2 disposed in the external environment and CR1 disposed in the sealed environment while ferromagnetic circuit member 911 includes air gap CR3 disposed in the external environment and air gap VR disposed in the sealed environment. It is noted that the magnets 300 of each of the ferromagnetic circuit members 910, 911 are also disposed in the external environment in a manner substantially similar to that described above with respect to FIGS. 8A and 8B. The air gaps CR1-CR3 may be constant reluctance air gaps. The air gap VR may be a variable reluctance air gap where the variable reluctance is caused by one or more scales of the track 202 (which is located within the air gap VR). A bridge member BR communicably connects the ferromagnetic circuit members 910, 911 to each other and includes a sensor air gap 905 in which the sensing member 803H is at least partially disposed. In operation the ferromagnetic bridge circuit 901 is substantially balanced whenever the air gap CR1-CR3, VR reluctances are substantially equal to each other. In the case where the ferromagnetic bridge circuit 901 is balanced the sensing member 803H does not detect a change in magnetic flux (or does not detect a magnetic flux) across the sensor air gap 905. The reluctance balance is disturbed by the motion of the track 202 scale(s) through the air gap VR. For example, in the case of a rotary track 202 (or in other aspects a linear track), as the track 202 moves the magnetic flux changes across the sensor air gap 905. The sensing member 803H senses or otherwise detects the changes in the magnetic flux due to, for example, a topology of the track scale(s) 202S while utilizing magnetic flux densities that can be adjusted to operate within the linear range of the sensing member 803H. It is noted that the flux densities can be adjusted in the ferromagnetic bridge circuit 901 by selecting the air gap CR1-CR2, VR reluctances.

As may be realized, in the aspects of the disclosed embodiment shown in FIGS. 8A-9C the portions of the ferromagnetic circuits (e.g. extension members 823, 824 and at least corresponding portions of ferromagnetic circuit in FIGS. 9A-9C disposed in the sealed environment that include the track air gap VR) that interface with the track 202 scale(s) 202S across the air aps 830, VR may include pick up features PIC (FIG. 9B) formed in or otherwise affixed to the ferromagnetic material of the circuits. These pick up features PIC may be disposed on opposite sides of the air gaps 830, VR and have a pitch substantially equal to the pitch P (FIG. 3) of a respective scale 202S and a size on the same order of magnitude as the ferromagnetic features 202SE of the scale 202S such that local flux are established that are capable of sensing the track 202 profile. These flux lines will add up and propagate to the sensing member 803H such that the result of the flux across the sensor air gap 810, 905 is substantially uniform for any given position of the track 202. As can be seen in FIG. 9B when the pick up features PIC are substantially aligned with the ferromagnetic features 202SE of the scale 202S substantially zero or no flux passes through the air gap 830, VR. When the pick up features PIC are misaligned with the ferromagnetic features 202SE of the scale 202S magnetic flux flows through the air gap 830, VR such that movement of the ferromagnetic features 202SE across the pick up features PIC produces a sinusoidal wave (as shown in FIG. 9D) that is detected by the sensing member 803H.

Figure 9D:
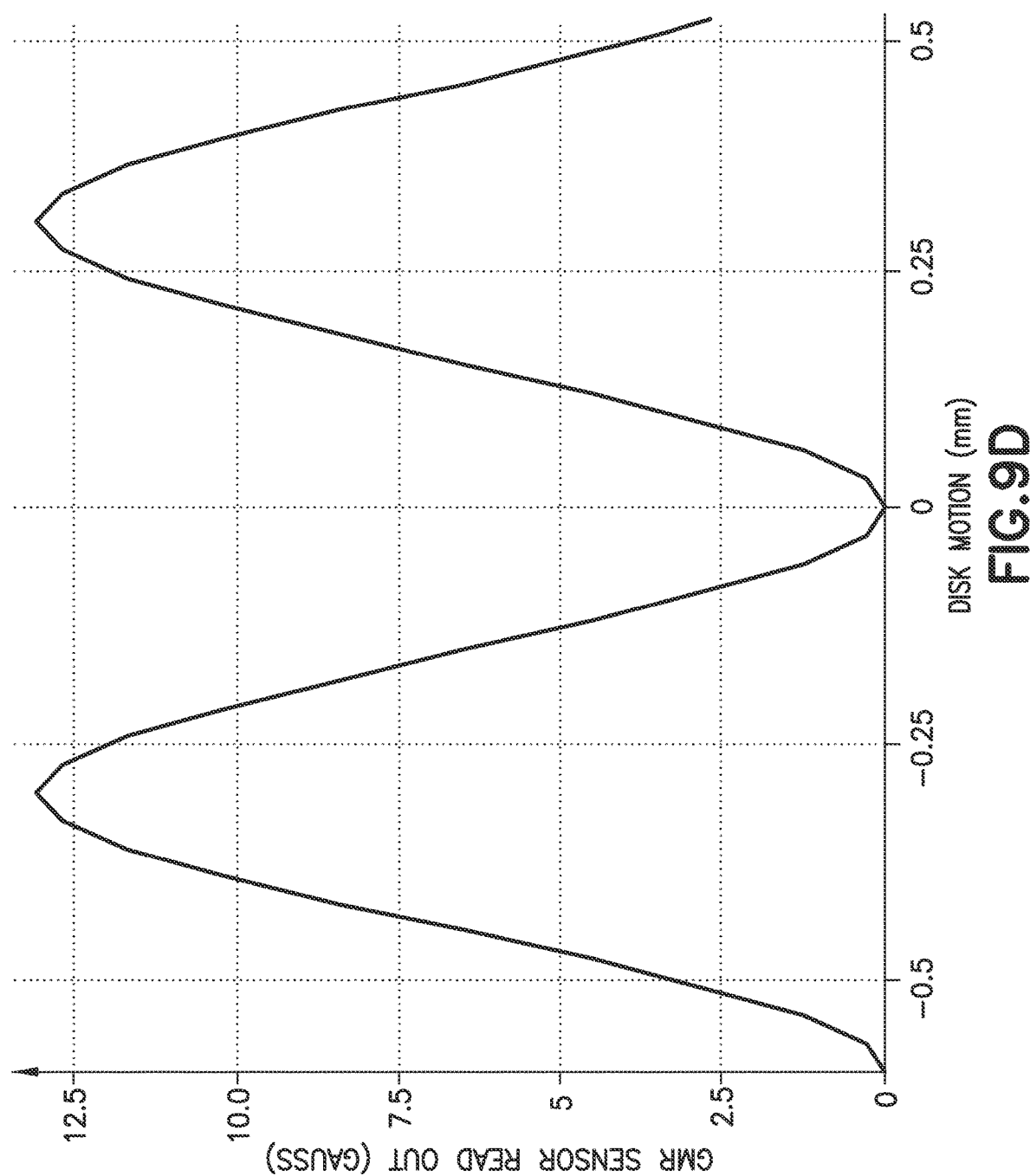
FIG. 9D is a graph of an exemplary sensor output in accordance with aspects of the disclosed embodiment.
Figure 10A:
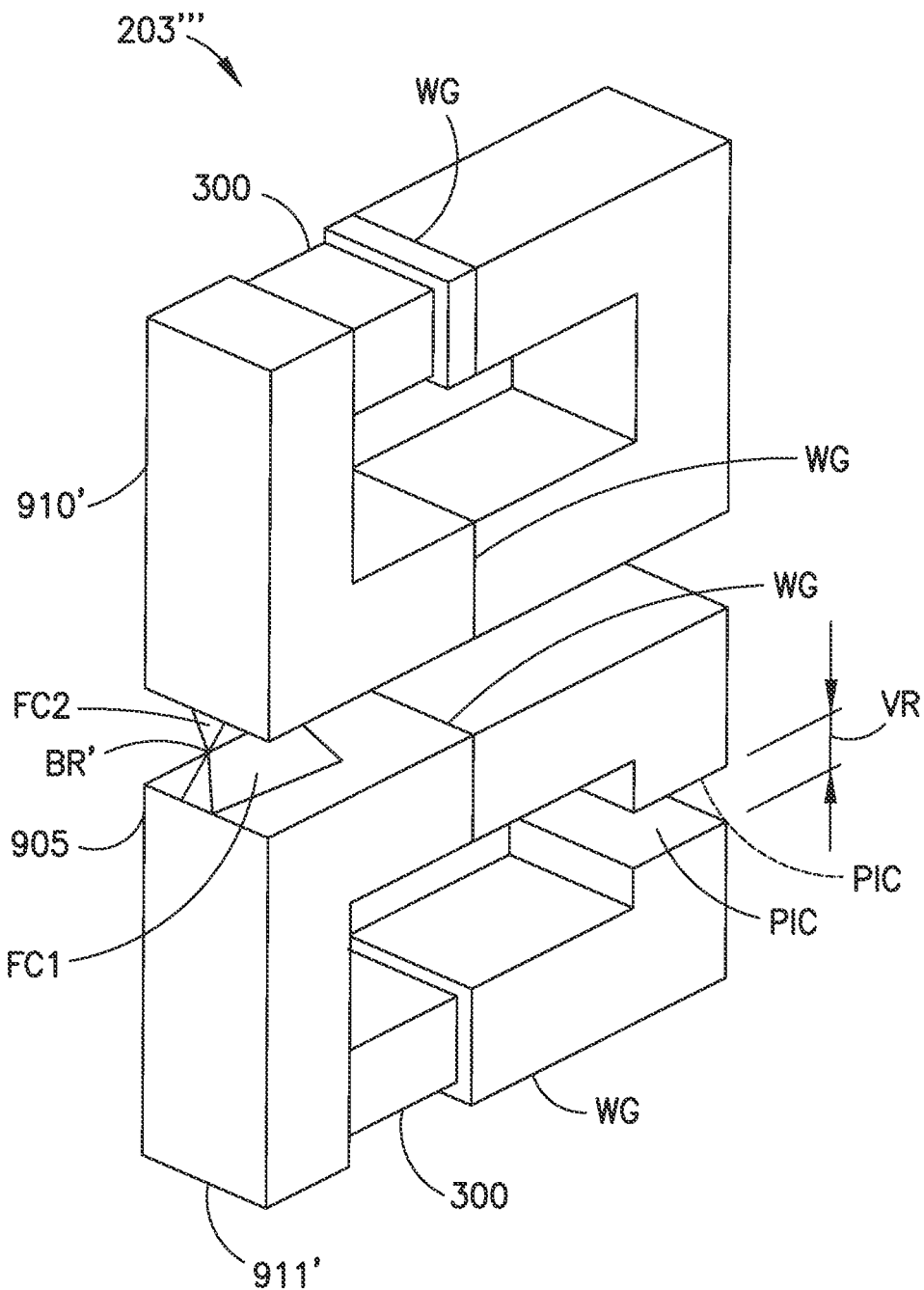
FIGS. 10A-10D are schematic illustrations of a portion of a sensor in accordance with aspects of the disclosed embodiment.
Figure 10B:
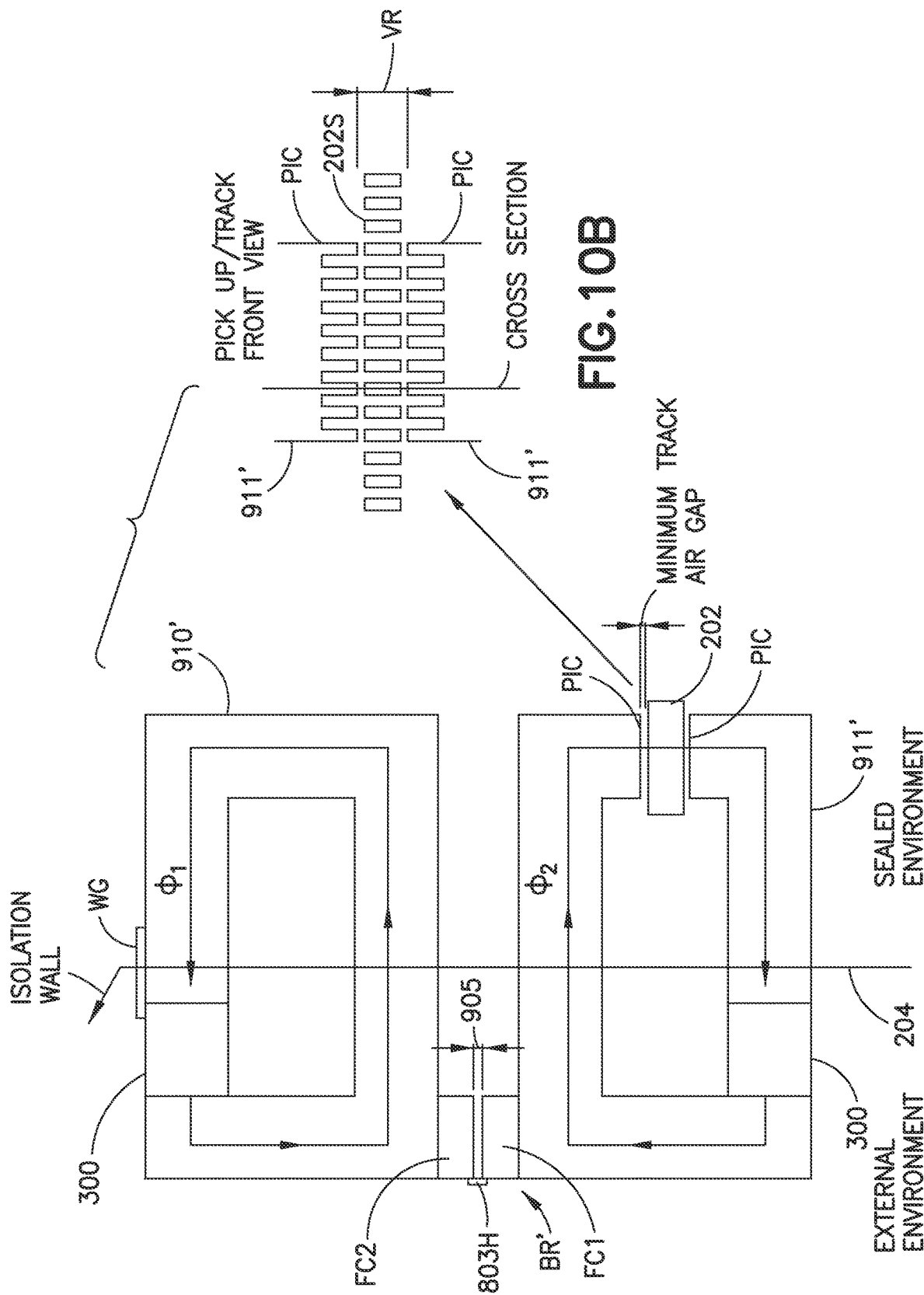
Figure 10C:
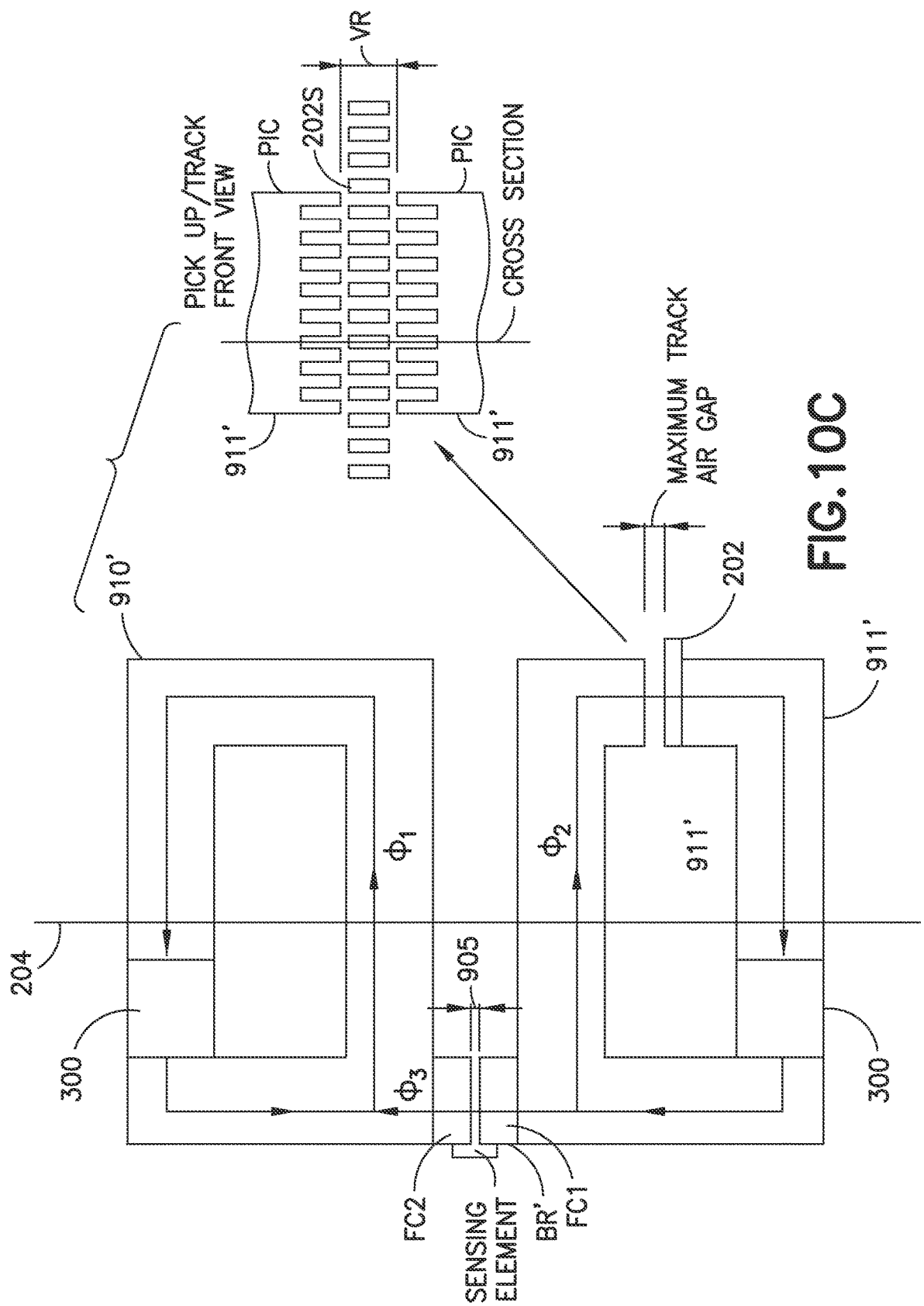

Referring now to FIGS. 10A-10C, a portion of a sensor 203''' is illustrated in accordance with an aspect of the disclosed embodiment. The sensor 203''' may be substantially similar to sensor 203" however, in this aspect the bridge member BR' includes flux concentrators FC1, FC2 configured to maximize the magnetic flux that flows between ferromagnetic circuit member 910' and ferromagnetic circuit member 911' such that the sensing member 803H is disposed across or at least partly within the sensor air gap 905 defined by the flux concentrators FC1, FC2. Also, in this aspect, the ferromagnetic circuit members 910', 911' are illustrated without the constant reluctance air gaps CR1-CR3 but in other aspects the ferromagnetic circuit members 910', 911' may include the constant reluctance air gaps CR1-CR3 in a manner substantially similar to that described above. As can also be seen in FIGS. 10A-10C an isolation wall may be disposed in a wall gap WG in a manner substantially similar to that described above with respect to FIGS. 8A-9C. In operation each ferromagnetic circuit member 910', 911' has a corresponding magnetic flux $\Phi_1$ and $\Phi_2$ associated therewith. In a manner substantially similar to that described above, as the track 202 moves within the air gap VR the ferromagnetic features 202SE of the track 202 move past the pick up features PIC of ferromagnetic circuit member 911' such that an air gap between the ferromagnetic features 202SE and the pick up features PIC changes as shown in FIGS. 10B and 10C. As can be seen in FIG. 10B when the pick up features PIC are substantially aligned with the ferromagnetic features 202SE of the scale 202S the effective air gap between the puck up features PIC and the track 202 is at its minimum value such that the fluxes $\Phi_1$ and $\Phi_2$ are substantially equal and substantially zero or no flux passes through the air gap VR and there is substantially no magnetic flux across the air gap 905. When the pick up features PIC are misaligned with the ferromagnetic features 202SE of the scale 202S the effective air gap between the pick up features PIC and the tack 202 can be brought to is maximum such that the reluctance across the air gap VR is higher than the reluctance across the air gap VR when the pick up features PIC are substantially aligned with the ferromagnetic features 202SE of the track 202 which causes a flux imbalance beetween the ferromagnetic circuit members 910', 911'. As a result of the flux imbalance between the ferromagnetic circuit members 910', 911' a magnetic flux flows through the air gap VR and as a result a flux $\Phi_3$ (detected or otherwise sensed by the sensing member 803H) flows across the sensor air gap 905. As may be realized, movement of the ferromagnetic features 202SE across the pick up features PIC causes the flux $\Phi_3$ to change between maximum and minimum values such that the flux $\Phi_3$ emulates a sinusoidal wave (e.g. as shown in FIG. 9D) that is detected by the sensing member 803H.

Figure 10D:
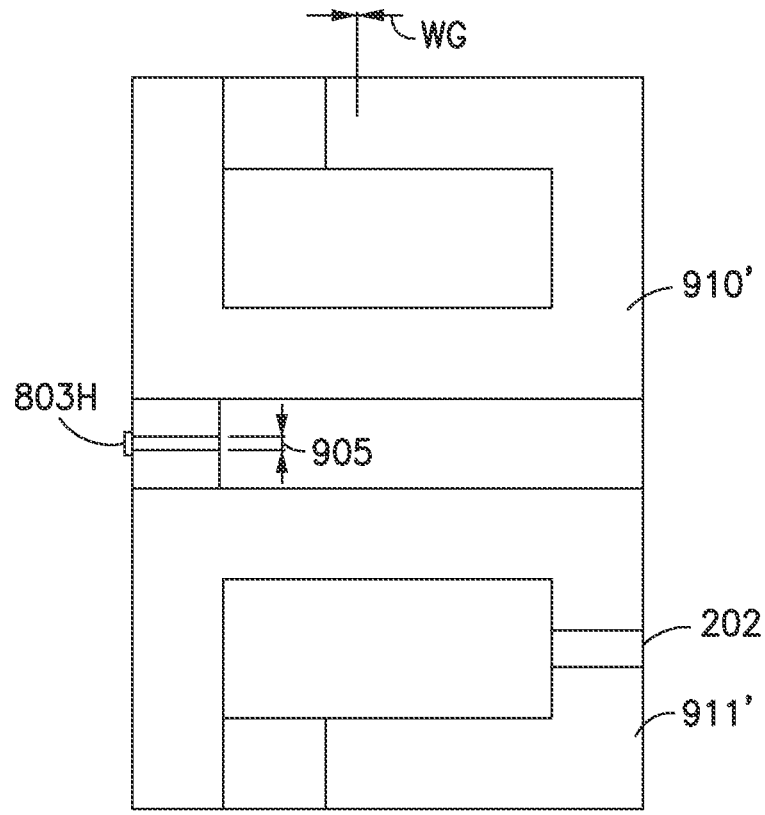

It is noted that the fluxes $\Phi_1$ and $\Phi_2$ can be adjusted in any suitable manner to balance the fluxes of the ferromagnetic circuit members 910', 911 such as by adjusting a size of the wall gap WG (e.g. a DC offset) of at least one of the ferromagnetic circuit members 910', 911' and/or the size of the sensor air gap 905 (e.g. a signal amplitude) as shown in FIG. 10D. As may be realized, the air gap 905 across the sensing member 803H may dictate an amount of maximum flux detected during points of misalignment between the pick up features PIC and the ferromagnetic features 202SE. It is also possible to induce a DC component of the magnetic flux by causing a constant imbalance between the ferromagnetic circuit members 910', 911' by altering the wall gap WG across the isolation wall of only one of the ferromagnetic circuit members 910', 911'.

Figure 11:
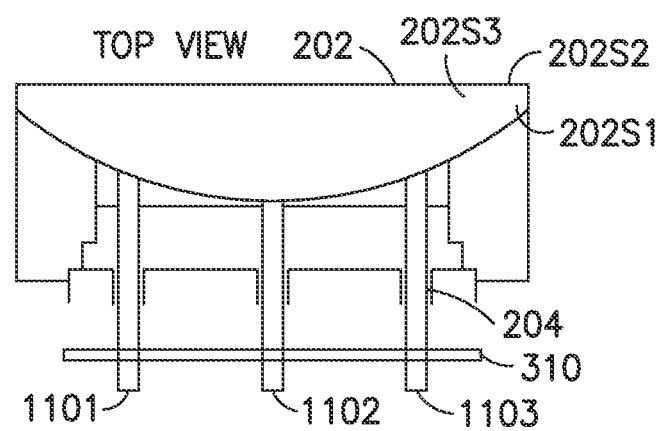
FIG. 11 is a schematic illustration of a sensor in accordance with aspects of the disclosed embodiment.

As may be realized, more than one sensor as shown in FIGS. 8A-9C and 10A-10D can be integrated with or otherwise mounted to the printed circuit board 310 in a manner substantially similar to that described above. As can be seen in FIG. 11 a sensor configuration is illustrated that is substantially similar to that described above with respect to FIGS. 5A, 6A-6C where the sensor track 202 includes a master scale 202S1 (e.g. that may generate a sine wave), a Nonius scale 202S2 (e.g. that may generate any suitable reference wave form) and a segment scale 202S3 (e.g. that may generate a cosine wave) where the master and segment scales are measured with reference to the Nonius scale. Corresponding ferromagnetic circuit members 1101-1103 (which may be substantially similar to one or more of the ferromagnetic circuit members described above with respect to FIGS. 8A-9C and 10A-10D) are integrated with or otherwise mounted to the printed circuit board 310 for interfacing with a respective one of the scales 202S1-202S3 such that the sensing member 803H is disposed adjacent a respective coil(s) 600 (FIGS. 5A and 7A-7D) for hysteresis compensation as described above. The signals from each of the sensing members of the ferromagnetic circuit members 1101-1103 may be processed as described above to determine the position of the track 202 and hence the robot drive 200 and/or arm(s) 208 connected to the robot drive.

As may be realized the aspects of the disclosed embodiment described above provide a position sensor that is capable of true absolute position measurement/feedback and for which no electronic components, cables or magnets are located in the sealed environment. As such there is no need for hermetically sealed connectors via feed-throughs in the isolation wall 204. As may also be realized, the aspects of the position sensor described herein provide for operation of the position sensor in a harsh environment (e.g. corrosive, extreme temperatures, high pressure, high vacuum, liquid media, etc.). The aspects of the position sensor described herein also provide for operation of the position sensor in the presence of contaminants (e.g. due to the magnetic principles on which the position sensor operates as described above) that may otherwise prevent reading the scales 202S of the track 202 such as in the case of an optical sensor.

In accordance with one or more aspects of the disclosed embodiment, a transport apparatus includes a housing; a drive mounted to the housing; at least one transport arm connected to the drive, the drive including at least one rotor having at least one salient pole of magnetic permeable material and disposed in an isolated environment, at least one stator having at least one salient pole with corresponding coil units and disposed outside the isolated environment where the at least one salient pole of the at least one stator the at least one salient pole of the rotor form a closed magnetic flux circuit between the at least one rotor and the at least one stator, and at least one seal partition configured to isolate the isolated environment; and at least one sensor, the at least one sensor including a magnetic sensor member connected to the housing, at least one sensor track connected to the at least one rotor where the at least one seal partition is disposed between and separates the magnetic sensor member and the at least one sensor track so that the at least one sensor track is disposed in the isolated environment and the magnetic sensor member is disposed outside the isolated environment.

In accordance with one or more aspects of the disclosed embodiment, at least a portion of the at least one seal partition is integral to the magnetic sensor member.

In accordance with one or more aspects of the disclosed embodiment, the at least one sensor comprises at least one ferromagnetic flux loop having a sensor air gap where the magnetic sensor member interfaces with the at least one ferromagnetic flux loop.

In accordance with one or more aspects of the disclosed embodiment, the magnetic sensor member is configured to detect changes in a reluctance of the sensor air gap.

In accordance with one or more aspects of the disclosed embodiment, the at least one ferromagnetic flux loop comprises first and second ferromagnetic flux loops having a sensor bridge member between the first and second ferromagnetic flux loops where the sensor air gap is located in the sensor bridge member, one of the first and second ferromagnetic flux loops having a track air gap in which at least a portion of the at least one sensor track is disposed.

In accordance with one or more aspects of the disclosed embodiment, the at least one ferromagnetic flux loop emulates a Wheatstone bridge.

In accordance with one or more aspects of the disclosed embodiment, each of the at least one ferromagnetic flux loop includes a track interface portion disposed in the isolated environment and a sensor member interface portion disposed outside the isolated environment, the track interface portion and the sensor member interface portion being separated by the at least one seal partition.

In accordance with one or more aspects of the disclosed embodiment, the at least one ferromagnetic flux loop includes flux concentrator elements disposed in the sensor air gap.

In accordance with one or more aspects of the disclosed embodiment, the at least one ferromagnetic flux loop includes a track air gap in which at least a portion of the at least one sensor track is disposed.

In accordance with one or more aspects of the disclosed embodiment, the at least one sensor includes a substantially featureless track interface.

In accordance with one or more aspects of the disclosed embodiment, the at least one sensor track includes a first track having a first pitch and at least a second track having a respective pitch that is different than at least the first pitch, and the at least one sensor includes a first sensor corresponding to the first track and at least a second sensor corresponding to a respective one of the at least second track.

In accordance with one or more aspects of the disclosed embodiment, the magnetic sensor member comprises a differential sensor having sensor elements arranged to substantially match a pitch of the at least one sensor track such that differential sine and cosine output signals are obtained from the magnetic sensor member.

In accordance with one or more aspects of the disclosed embodiment, the sensor elements form a Wheatstone bridge.

In accordance with one or more aspects of the disclosed embodiment, the sensor elements are disposed on a common printed circuit board of the magnetic sensor member.

In accordance with one or more aspects of the disclosed embodiment, the at least one sensor interfaces substantially directly with the at least one sensor track through the at least one seal partition.

In accordance with one or more aspects of the disclosed embodiment, a transport apparatus includes a housing; a drive mounted to the housing; at least one transport arm connected to the drive, the drive including at least one rotor having at least one salient pole of magnetic permeable material and disposed in an isolated environment, at least one stator having at least one salient pole with corresponding coil units and disposed outside the isolated environment where the at least one salient pole of the at least one stator the at least one salient pole of the rotor form a closed magnetic flux circuit between the at least one rotor and the at least one stator, and at least one seal partition configured to isolate the isolated environment; at least one sensor, the at least one sensor including a magnetic sensor member connected to the housing, at least one sensor track connected to the at least one rotor where the at least one seal partition is disposed between and separates the magnetic sensor member and the at least one sensor track so that the at least one sensor track is disposed in the isolated environment and the magnetic sensor member is disposed outside the isolated environment; and a sensor controller configured to generate sensor signal commands to the at least one sensor based on sensor signals received from the at least one sensor, where the sensor signal commands effect a change in at least a predetermined characteristic of the sensor signals.

In accordance with one or more aspects of the disclosed embodiment, at least a portion of the at least one seal partition is integral to the magnetic sensor member.

In accordance with one or more aspects of the disclosed embodiment, the at least one sensor comprises at least one ferromagnetic flux loop having a sensor air gap where the magnetic sensor member interfaces with the ferromagnetic flux loop.

In accordance with one or more aspects of the disclosed embodiment, the magnetic sensor member is configured to detect changes in a reluctance of the sensor air gap.

In accordance with one or more aspects of the disclosed embodiment, the at least one ferromagnetic flux loop comprises first and second ferromagnetic flux loops having a sensor bridge member between the first and second ferromagnetic flux loops where the sensor air gap is located in the sensor bridge member, one of the first and second ferromagnetic flux loops having a track air gap in which at least a portion of the at least one sensor track is disposed.

In accordance with one or more aspects of the disclosed embodiment, the at least one ferromagnetic flux loop emulates a Wheatstone bridge.

In accordance with one or more aspects of the disclosed embodiment, each of the at least one ferromagnetic flux loop includes a track interface portion disposed in the isolated environment and a sensor member interface portion disposed outside the isolated environment, the track interface portion and the sensor member interface portion being separated by the at least one seal partition.

In accordance with one or more aspects of the disclosed embodiment, wherein the at least one ferromagnetic flux loop includes flux concentrator elements disposed in the sensor air gap.

In accordance with one or more aspects of the disclosed embodiment, the at least one ferromagnetic flux loop includes a track air gap in which at least a portion of the at least one sensor track is disposed In accordance with one or more aspects of the disclosed embodiment, the at least one sensor includes a substantially featureless track interface In accordance with one or more aspects of the disclosed embodiment, the at least one sensor track includes a first track having a first pitch and at least a second track having a respective pitch that is different than at least the first pitch, and the at least one sensor includes a first sensor corresponding to the first track and at least a second sensor corresponding to a respective one of the at least second track.

In accordance with one or more aspects of the disclosed embodiment, the magnetic sensor member comprises a differential sensor having sensor elements arranged to substantially match a pitch of the at least one sensor track such that differential sine and cosine output signals are obtained from the magnetic sensor member.

In accordance with one or more aspects of the disclosed embodiment, the sensor elements form a Wheatstone bridge.

In accordance with one or more aspects of the disclosed embodiment, the sensor elements are disposed on a common printed circuit board of the magnetic sensor member.

In accordance with one or more aspects of the disclosed embodiment, the at least one sensor interfaces substantially directly with the at least one sensor track through the at least one seal partition.

In accordance with one or more aspects of the disclosed embodiment, a transport apparatus includes a housing; a drive mounted to the housing; at least one transport arm connected to the drive, the drive including at least one rotor having at least one salient pole of magnetic permeable material and disposed in an isolated environment, at least one stator having at least one salient pole with corresponding coil units and disposed outside the isolated environment where the at least one salient pole of the at least one stator the at least one salient pole of the rotor form a closed magnetic flux circuit between the at least one rotor and the at least one stator, and at least one seal partition configured to isolate the isolated environment; at least one sensor, the at least one sensor including a magnetic sensor member connected to the housing, at least one sensor track connected to the at least one rotor where the at least one seal partition is disposed between and separates the magnetic sensor member and the at least one sensor track so that the at least one sensor track is disposed in the isolated environment and the magnetic sensor member is disposed outside the isolated environment; a sensor controller communicably connected to the at least one sensor, the sensor controller being configured to provide sensor signal commands; and a motion controller communicably connected to the at least one sensor and the sensor controller and configured to receive sensor signals from the at least one sensor, where the sensor controller is configured to control a change in at least a predetermined characteristic of the sensor signals in response to communications from the motion controller.

In accordance with one or more aspects of the disclosed embodiment, at least a portion of the at least one seal partition is integral to the magnetic sensor member.

In accordance with one or more aspects of the disclosed embodiment, the at least one sensor comprises at least one ferromagnetic flux loop having a sensor air gap where the magnetic sensor member interfaces with the ferromagnetic flux loop.

In accordance with one or more aspects of the disclosed embodiment, the magnetic sensor member is configured to detect changes in a reluctance of the sensor air gap.

In accordance with one or more aspects of the disclosed embodiment, the at least one ferromagnetic flux loop comprises first and second ferromagnetic flux loops having a sensor bridge member between the first and second ferromagnetic flux loops where the sensor air gap is located in the sensor bridge member, one of the first and second ferromagnetic flux loops having a track air gap in which at least a portion of the at least one sensor track is disposed.

In accordance with one or more aspects of the disclosed embodiment, the at least one ferromagnetic flux loop emulates a Wheatstone bridge.

In accordance with one or more aspects of the disclosed embodiment, each of the at least one ferromagnetic flux loop includes a track interface portion disposed in the isolated environment and a sensor member interface portion disposed outside the isolated environment, the track interface portion and the sensor member interface portion being separated by the at least one seal partition.

In accordance with one or more aspects of the disclosed embodiment, the at least one ferromagnetic flux loop includes flux concentrator elements disposed in the sensor air gap.

In accordance with one or more aspects of the disclosed embodiment, the at least one ferromagnetic flux loop includes a track air gap in which at least a portion of the at least one sensor track is disposed.

In accordance with one or more aspects of the disclosed embodiment, the at least one sensor includes a substantially featureless track interface.

In accordance with one or more aspects of the disclosed embodiment, the at least one sensor track includes a first track having a first pitch and at least a second track having a respective pitch that is different than at least the first pitch, and the at least one sensor includes a first sensor corresponding to the first track and at least a second sensor corresponding to a respective one of the at least second track.

In accordance with one or more aspects of the disclosed embodiment, the magnetic sensor member comprises a differential sensor having sensor elements arranged to substantially match a pitch of the at least one sensor track such that differential sine and cosine output signals are obtained from the magnetic sensor member.

In accordance with one or more aspects of the disclosed embodiment, the sensor elements form a Wheatstone bridge.

In accordance with one or more aspects of the disclosed embodiment, the sensor elements are disposed on a common printed circuit board of the magnetic sensor member.

In accordance with one or more aspects of the disclosed embodiment, the at least one sensor interfaces substantially directly with the at least one sensor track through the at least one seal partition.

In accordance with one or more aspects of the disclosed embodiment, a transport apparatus includes a housing; a drive mounted to the housing; at least one transport arm connected to the drive, the drive including at least one rotor having at least one salient pole of magnetic permeable material and disposed in an isolated environment, at least one stator having at least one salient pole with corresponding coil units and disposed outside the isolated environment where the at least one salient pole of the at least one stator the at least one salient pole of the rotor form a closed magnetic flux circuit between the at least one rotor and the at least one stator, and at least one seal partition configured to isolate the isolated environment; at least one sensor, the at least one sensor including a magnetic sensor member connected to the housing, at least one sensor track connected to the at least one rotor where the at least one seal partition is disposed between and separates the magnetic sensor member and the at least one sensor track so that the at least one sensor track is disposed in the isolated environment and the magnetic sensor member is disposed outside the isolated environment; and a sensor controller configured for real-time sensor signal tuning in response to variations in at least one of an ambient condition of the at least one sensor or state condition of the at least one sensor.

In accordance with one or more aspects of the disclosed embodiment, the ambient condition of the at least one sensor is a temperature of the at least one sensor.

In accordance with one or more aspects of the disclosed embodiment, the state condition of the at least one sensor is at least one of a rotation direction of the at least one sensor track or sensor hysteresis.

In accordance with one or more aspects of the disclosed embodiment, wherein at least a portion of the at least one seal partition is integral to the magnetic sensor member.

In accordance with one or more aspects of the disclosed embodiment, the at least one sensor comprises at least one ferromagnetic flux loop having a sensor air gap where the magnetic sensor member interfaces with the at least one ferromagnetic flux loop.

In accordance with one or more aspects of the disclosed embodiment, the magnetic member is configured to detect changes in a reluctance of the sensor air gap.

In accordance with one or more aspects of the disclosed embodiment, the at least one ferromagnetic flux loop comprises first and second ferromagnetic flux loops having a sensor bridge member between the first and second ferromagnetic flux loops where the sensor air gap is located in the sensor bridge member, one of the first and second ferromagnetic flux loops having a track air gap in which at least a portion of the at least one sensor track is disposed.

In accordance with one or more aspects of the disclosed embodiment, the at least one ferromagnetic flux loop emulates a Wheatstone bridge.

In accordance with one or more aspects of the disclosed embodiment, each of the at least one ferromagnetic flux loop includes a track interface portion disposed in the isolated environment and a sensor member interface portion disposed outside the isolated environment, the track interface portion and the sensor member interface portion being separated by the at least one seal partition.

In accordance with one or more aspects of the disclosed embodiment, the at least one ferromagnetic flux loop includes flux concentrator elements disposed in the sensor air gap.

In accordance with one or more aspects of the disclosed embodiment, the at least one ferromagnetic flux loop includes a track air gap in which at least a portion of the at least one sensor track is disposed.

In accordance with one or more aspects of the disclosed embodiment, the at least one sensor includes a substantially featureless track interface.

In accordance with one or more aspects of the disclosed embodiment, the at least one sensor track includes a first track having a first pitch and at least a second track having a respective pitch that is different than at least the first pitch, and the at least one sensor includes a first sensor corresponding to the first track and at least a second sensor corresponding to a respective one of the at least second track.

In accordance with one or more aspects of the disclosed embodiment, the magnetic sensor member comprises a differential sensor having sensor elements arranged to substantially match a pitch of the at least one sensor track such that differential sine and cosine output signals are obtained from the magnetic sensor member.

In accordance with one or more aspects of the disclosed embodiment, the sensor elements form a Wheatstone bridge.

In accordance with one or more aspects of the disclosed embodiment, the sensor elements are disposed on a common printed circuit board of the magnetic sensor member.

In accordance with one or more aspects of the disclosed embodiment, the at least one sensor interfaces substantially directly with the at least one sensor track through the at least one seal partition.

In accordance with one or more aspects of the disclosed embodiment, a transport apparatus includes a frame; a drive section connected to the frame having at least one drive shaft; a transport arm movably mounted to the drive section and driven by the at least one drive shaft; and a position feedback apparatus including at least one track mounted to a respective one of the at least one drive shaft, each of the at least one track having at least one scale disposed thereon, and at least one read head corresponding to a respective track, the at least one read head including at least one sensor mounted to a common support member, the at least one sensor being configured to sense a respective scale on the respective track, and at least one energizing coil integrally formed with the support member.

In accordance with one or more aspects of the disclosed embodiment, the at least one energizing coil is configured to generate an energizing pulse through a respective sensor to substantially eliminate sensor hysteresis.

In accordance with one or more aspects of the disclosed embodiment, the transport apparatus further includes a controller connected to the at least one read head, the controller being configured to sample track data from the at least one sensor so that sampling occurs a predetermined time after the energizing pulse through the respective sensor is generated.

In accordance with one or more aspects of the disclosed embodiment, the energizing pulse saturates the sensor.

In accordance with one or more aspects of the disclosed embodiment, the at least one read head and the respective track are separated from one another by an isolation wall such that the respective track is disposed in a first environment and the at least one read head is disposed in a second environment different than the first environment.

In accordance with one or more aspects of the disclosed embodiment, the first environment is a vacuum environment and the second environment is an atmospheric environment.

In accordance with one or more aspects of the disclosed embodiment, the at least one sensor includes a substantially featureless track interface.

In accordance with one or more aspects of the disclosed embodiment, the at least one scale includes a first scale having a first pitch and at least a second scale having a respective pitch that is different from at least the first pitch and the at least one sensor includes a first sensor corresponding to the first scale and at least a second sensor corresponding to a respective one of the at least second scale.

In accordance with one or more aspects of the disclosed embodiment, the first sensor and the at least second sensor are immovably fixed to the support member.

In accordance with one or more aspects of the disclosed embodiment, the at least one sensor comprises a giant magneto resistive sensor or any suitable magnetic sensor.

In accordance with one or more aspects of the disclosed embodiment a variable reluctance motor assembly includes a casing having a drum structure, a stator mounted within the drum structure, a rotor mounted within the drum structure and interfaced with the stator, a sensor track connected to the rotor, and a giant magneto resistive sensor mounted to the casing, where the casing includes a common datum that forms a stator interface surface configured to support the stator and position the stator and rotor relative to each other for effecting a predetermined gap between the stator and rotor and configured to support the giant magneto resistive sensor in a predetermined position relative to the common datum so as to effect a predetermined gap between the giant magneto resistive sensor and sensor track, where the stator, rotor, giant magneto resistive sensor and sensor track are positioned relative to and depend from the common datum.

In accordance with one or more aspects of the disclosed embodiment the variable reluctance motor assembly further includes an isolation wall 2403 supported by the stator such that the isolation wall is located in a predetermined position relative to the common datum and the rotor.

In accordance with one or more aspects of the disclosed the casing is a monolithic member that forms the drum structure and into which slots are formed for one or more of sensors, control boards and drive connectors.

In accordance with one or more aspects of the disclosed embodiment the casing is an integral assembly formed by two or more hoop members connected to each other to form the drum structure.

In accordance with one or more aspects of the disclosed embodiment a variable reluctance motor casing includes an exterior surface, an interior surface where the exterior and interior surfaces form a drum structure, the interior surface including a common datum that forms a stator interface surface configured to support a stator and position the stator and a rotor relative to each within the casing to effect a predetermined gap between the stator and rotor, and a sensor interface surface configured to support a giant magneto resistive sensor relative to a sensor track connected to the rotor and effect a predetermined gap between the giant magneto resistive sensor and sensor track, where the sensor interface surface is positioned relative to the common datum so that the stator, rotor and giant magneto resistive sensor are positioned from and supported by the common datum.

In accordance with one or more aspects of the disclosed embodiment the interior surface includes a rotor interface surface positioned relative to the common datum so that the stator and rotor are positioned from and supported by the common datum.

In accordance with one or more aspects of the disclosed embodiment, the sensor interface surface is formed as a slot within the drum structure.

In accordance with one or more aspects of the disclosed embodiment, the slot is configured to house the sensor and a motor control board.

In accordance with one or more aspects of the disclosed the drum structure is a monolithic member into which slots are formed for one or more of sensors, control boards and drive connectors.

In accordance with one or more aspects of the disclosed embodiment the drum structure is an integral assembly formed by two or more hoop members connected to each other.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A variable reluctance motor assembly comprising:
   a casing having a drum structure, a stator mounted within the drum structure, a rotor mounted within the drum structure and interfaced with the stator;
   a sensor track connected to the rotor; and
   a giant magneto resistive sensor mounted to the casing, where the casing includes a common datum that forms a stator interface surface configured to support the stator and position the stator and rotor relative to each other for effecting a predetermined gap between the stator and rotor and configured to support the giant magneto resistive sensor in a predetermined position relative to the common datum so as to effect a predetermined gap between the giant magneto resistive sensor and sensor track, where the stator, rotor, giant magneto resistive sensor and sensor track are positioned relative to and depend from the common datum.

2. The variable reluctance motor assembly of claim 1, further comprising an isolation wall supported by the stator such that the isolation wall is located in a predetermined position relative to the common datum and the rotor.

3. The variable reluctance motor assembly of claim 1, wherein the casing is a monolithic member that forms the drum structure and into which slots are formed for one or more of sensors, control boards and drive connectors.

4. The variable reluctance motor assembly of claim 1, wherein the casing is an integral assembly formed by two or more hoop members connected to each other to form the drum structure.

5. A variable reluctance motor casing comprising:
   an exterior surface;
   an interior surface where the exterior and interior surfaces form a drum structure, the interior surface including a common datum that forms a stator interface surface configured to support a stator and position the stator and a rotor relative to each within the casing to effect a predetermined gap between the stator and rotor; and
   a sensor interface surface configured to support a giant magneto resistive sensor relative to a sensor track connected to the rotor and effect a predetermined gap between the giant magneto resistive sensor and sensor track, where the sensor interface surface is positioned relative to the common datum so that the stator, rotor and giant magneto resistive sensor are positioned from and supported by the common datum.

6. The variable reluctance motor casing of claim 5, wherein the interior surface includes a rotor interface surface positioned relative to the common datum so that the stator and rotor are positioned from and supported by the common datum.

7. The variable reluctance motor casing of claim 5, wherein the sensor interface surface is formed as a slot within the drum structure.

8. The variable reluctance motor casing of claim 7, wherein the slot is configured to house the sensor and a motor control board.

9. The variable reluctance motor casing of claim 5, wherein the drum structure is a monolithic member into which slots are formed for one or more of sensors, control boards and drive connectors.

10. The variable reluctance motor casing of claim 5, wherein the drum structure is an integral assembly formed by two or more hoop members connected to each other.

11. A variable reluctance motor assembly comprising:
    a casing having a monocoque structure, a stator mounted within the monocoque structure, a rotor mounted within the monocoque structure and interfaced with the stator;
    a sensor track connected to the rotor; and
    a giant magneto resistive sensor mounted to the casing, where the casing includes a common datum that forms a stator interface surface configured to support the stator and position the stator and rotor relative to each other for effecting a predetermined gap between the stator and rotor and configured to support the giant magneto resistive sensor in a predetermined position relative to the common datum so as to effect a predetermined gap between the giant magneto resistive sensor and sensor track, where the stator, rotor, giant magneto resistive sensor and sensor track are positioned relative to and depend from the common datum.

12. The variable reluctance motor assembly of claim 11, further comprising an isolation wall supported by the stator such that the isolation wall is located in a predetermined position relative to the common datum and the rotor.

13. The variable reluctance motor assembly of claim 11, wherein the casing is a monolithic member that forms the monocoque structure and into which slots are formed for one or more of sensors, control boards and drive connectors.

14. The variable reluctance motor assembly of claim 11, wherein the casing is an integral assembly formed by two or more hoop members connected to each other to form the monocoque structure.

15. The variable reluctance motor assembly of claim 11, wherein the casing includes and exterior surface, and an interior surface, where the exterior and interior surfaces form the monocoque structure, the interior surface including the common datum that forms the stator interface surface configured to support the stator and position the stator and the rotor relative to each other to effect the predetermined gap between the stator and rotor.

16. The variable reluctance motor assembly of claim 15, wherein the interior surface includes a rotor interface surface positioned relative to the common datum so that the stator and rotor are positioned from and supported by the common datum.

17. The variable reluctance motor assembly of claim 15, wherein the monocoque structure includes a sensor interface surface configured to support the giant magneto resistive sensor relative to the sensor track, and effect the predetermined gap between the giant magneto resistive sensor and the sensor track, where the sensor interface surface is positioned relative to the common datum so that the stator, rotor, and giant magneto resistive sensor are positioned from and supported by the common datum.

18. The variable reluctance motor assembly of claim 17, wherein the sensor interface surface is formed as a slot within the monocoque structure.

19. The variable reluctance motor assembly of claim 18, wherein the slot is configured to house the giant magneto resistive sensor and a motor control board.

\* \* \* \* \*